(12) United States Patent
Kwon et al.

(10) Patent No.: US 12,410,278 B2
(45) Date of Patent: Sep. 9, 2025

(54) POLYMER AND ORGANIC ELECTRONIC DEVICE USING SAME

(71) Applicant: INDUSTRY-ACADEMIC COOPERATION FOUNDATION GYEONGSANG NATIONAL UNIVERSITY, Jinju-si (KR)

(72) Inventors: Soon-Ki Kwon, Jinju-si (KR); Yun-Hi Kim, Jinju-si (KR); Cheng Sun, Jinju-si (KR)

(73) Assignee: INDUSTRY-ACADEMIC COOPERATION FOUNDATION GYEONGSANG NATIONAL UNIVERSITY, Jinju-si (KR)

( * ) Notice: Subject to any disclaimer, the term of this patent is extended or adjusted under 35 U.S.C. 154(b) by 532 days.

(21) Appl. No.: 17/772,513

(22) PCT Filed: Dec. 10, 2020

(86) PCT No.: PCT/KR2020/017991
§ 371 (c)(1),
(2) Date: Apr. 28, 2022

(87) PCT Pub. No.: WO2021/118238
PCT Pub. Date: Jun. 17, 2021

(65) Prior Publication Data
US 2022/0396661 A1 Dec. 15, 2022

(30) Foreign Application Priority Data

Dec. 10, 2019 (KR) .................. 10-2019-0164094
Dec. 8, 2020 (KR) .................. 10-2020-0170476

(51) Int. Cl.
| | | |
|---|---|---|
| C08G 61/12 | (2006.01) | |
| H10K 30/00 | (2023.01) | |
| H10K 30/30 | (2023.01) | |
| H10K 30/50 | (2023.01) | |
| H10K 85/10 | (2023.01) | |

(52) U.S. Cl.
CPC ........... *C08G 61/126* (2013.01); *H10K 30/00* (2023.02); *H10K 85/113* (2023.02); *H10K 30/30* (2023.02); *H10K 30/50* (2023.02)

(58) Field of Classification Search
CPC .......... C08G 61/126; C08G 2261/1412; C08G 2261/146; C08G 2261/148; C08G 2261/1646; C08G 2261/3223; C08G 2261/3246; C08G 2261/334; C08G 2261/344; C08G 2261/414; H10K 30/00; H10K 85/113; H10K 85/151; H10K 30/30; H10K 30/50; C08L 65/00; C09D 165/00; C09K 11/06; Y02E 10/549
See application file for complete search history.

(56) References Cited

FOREIGN PATENT DOCUMENTS

| CN | 107298758 A | 10/2017 | |
|---|---|---|---|
| CN | 109134513 | * 1/2019 | ........... C07D 513/22 |
| CN | 109694464 A | 4/2019 | |
| CN | 110734539 A | 1/2020 | |
| KR | 10-2019-0064407 A | 6/2019 | |
| KR | 10-2019-0064408 A | 6/2019 | |

OTHER PUBLICATIONS

Chen et al. "Changing the π-bridge from thiophene to thieno[3,2-b]thiophene for the D-π-A type polymer enables high performance fullerene-free organic solar cells", ChemComm., Issue47 (Year: 2019).*
Korean Office Action for KR Application No. 10-2020-0170476 mailed on Aug. 4, 2022.
Yuan, J. et al, "Fused Benzothiadiazole: A Building Block for n-Type Organic Acceptor to Achieve High-Performance Organic Solar Cells," Advanced Materials, 2019, thesis No. 1807577, inner pp. 1-8.
Yao, H. et al., "Efficient all-polymer solar cells based on a new polymer acceptor achieving 10.3% power conversion efficiency," ACS Energy Letters, 2019, pp. 417-422, vol. 4.
International Search Report mailed Mar. 29, 2021 for PCT/KR2020/017991.

* cited by examiner

*Primary Examiner* — Jessica M Roswell
(74) *Attorney, Agent, or Firm* — CANTOR COLBURN LLP

(57) ABSTRACT

The present invention relates to a novel polymer and an organic electronic device using same. In the polymer according to the present invention, a cyclic electron-donor, including thiophene, selenophene, or a combination thereof, is introduced into a central skeleton having an A-D-A structure including an electron-donor and electron-acceptor unit. Thus, the polymer has not only excellent chemical and thermal stability, but also good crystallinity. Moreover, intermolecular stacking is possible, and thus charge mobility can be maximized.

13 Claims, 4 Drawing Sheets

POLYMER AND ORGANIC ELECTRONIC DEVICE USING SAME

TECHNICAL FIELD

The present invention relates to a novel polymer and an organic electronic device using the same.

BACKGROUND ART

In recent years, as an oil price problem and an environmental pollution problem due to the use of fossil fuels emerge, there has been an upsurge in demand for a sustainable environmentally friendly energy source. A representative environmentally friendly energy source includes solar power, wind power, hydro power, wave power, geothermal heat, and the like, and among them, a solar cell which may generate electricity using sunlight receives attention as an unlimited electrical energy source having the least restrictions on places. An amount of solar energy substantially excavated from a solar energy of $1.7 \times 10^5$ TW reaching the earth's surface is estimated to be 600 TW. Here, when a solar-light power station having an efficiency of 10% may be used, about 60 TW of electricity of may be supplied. This is an enormous amount which more than satisfies future needs for a sustainable energy source, as compared with the earth's expected energy demand of 28 TW in 2050.

As for the conventional solar cell, a first-generation crystalline silicon solar cell using an inorganic material accounts for 90% of a solar light power generation market. However, since the power generation cost thereof is 5 to 20 times or more higher than that of a fossil fuel, the first-generation crystalline silicon solar cell is only used for long-term medium or large-scale power generation, and the application value thereof was low. Thus, a second-generation thin film solar cell technology (such as CdTe and CIGS) replacing the silicon solar cell rises suddenly, and accounts for the remaining 10% of the market. However, the second-generation solar cell technology also essentially requires high-priced equipment, since some of the materials are classified as a precious metal and a semiconductor thin film is formed by a vacuum process, a high-temperature process, and the like in the manufacture of a device. As a low-priced solar cell for solving the problems, there is an organic solar cell. Since the organic solar cell uses an organic material, a solution process is allowed to lower the unit price of the solar cell and application possibilities such as clothing, portable electrical appliances, and electronic products are endless due to mechanical flexibility, ease of design, and versatility, and thus, the organic solar cell emerges as a next-generation solar cell.

However, for practical use of the organic solar cell, efficiency improvement, life extension, a larger area, development of a printable material, securing of a transparent electrode, and the like are prerequisites. Among them, the higher efficiency of the organic solar cell may be by far important. The unit cost of production may be significantly lowered and the problems described above may be solved in series only by developing a high-solubility and high-performance (high-efficiency and high-stability) material allowing a low-temperature solution process.

Recently, the organic solar cell is divided into a fullerene-based organic solar cell and a non-fullerene organic solar cell, depending on the photoactive layer electron acceptor material. The highest efficiency of the organic solar cell in the world is currently 11.5% in the case of a fullerene-based organic solar cell, based on the authentication of the National Renewable Energy Laboratory (NREL), and is unofficially 13.1% in the case of a non-fullerene-based organic solar cell. It took about 15 years or more to develop the fullerene-based organic solar cell to the current level, while it took only less than 5 years to develop the non-fullerene-based organic solar cell to the current level. In addition, in terms of stability of the organic solar cell also, it has been reported that the non-fullerene-based organic solar cell was largely better than the fullerene-based organic solar cell. Representatively, it has been reported that when PCE11, which is an analogous derivative showing a highest efficiency of the fullerene-based organic solar cell in the world, undergoes aging for 5 days in the air, burn-in decomposition occurs, so that the efficiency is decreased by about 39%.

Under the technical background as such, the present inventors intend to suggest a novel polymer which may implement high performance in a non-fullerene-based organic solar cell having excellent stability and a use thereof.

DISCLOSURE

Technical Problem

An object of the present invention is to provide a novel polymer which has an extended conjugated structure, allows intermolecular stacking, and has maximized intramolecular charge carrier mobility, and a use thereof.

Specifically, an object of the present invention is to provide a polymer which may implement high performance in a non-fullerene-based organic solar cell by adjusting constituents of a polymer and ratios thereof so as to have appropriate crystallinity, solubility, and an optimal high occupied molecular orbital (HOMO) offset energy level with a relative electron donor material.

Specifically, another object of the present invention is to provide an organic electronic device having excellent light efficiency by adopting the polymer of the present invention.

Specifically, another object of the present invention is to provide an organic solar cell having excellent power conversion efficiency by adopting the polymer of the present invention in a photoactive layer.

Technical Solution

For the above objects, the present invention may include the following means.

In one general aspect, a polymer having a structure having minimized steric hindrance, excellent solubility and oxidative stability, and maximized charge carrier mobility includes: repeating units represented by the following Chemical Formula 1 and Chemical Formula 2, by having an A-D-A compound formed of a central electron donor unit (D) and an end electron acceptor unit (A) at both sides of the central electron donor unit (D) as a central skeleton and introducing an electron donor in an appropriate embodiment:

[Chemical Formula 1]

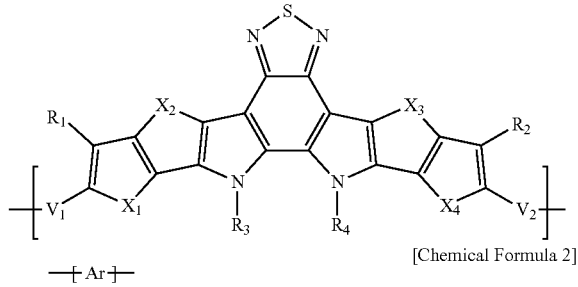

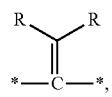

[Chemical Formula 2]

wherein

R₁ to R₄ are independently of one another C1-C30 alkyl;

X₁ to X₄ are independently of one another O, S, or Se;

V₁ and V₂ are independently of each other a fused ring having methylidene as a linking group, the fused ring may be independently of each other further substituted by one or more substituents selected from C1-C30 alkyl, C1-C30 alkoxy, C1-C30 alkylthio, halogen, cyano, haloC1-C30 alkyl, nitro, and hydroxy, —CH₂— of the fused ring may be replaced with carbonyl, thiocarbonyl, or $$*-\overset{\overset{\displaystyle R}{|}}{\underset{\underset{\displaystyle R}{|}}{C}}-*,$$

in which R is independently of each other hydrogen, C1-C30 alkyl, C1-C30 alkoxy, C1-C30 alkylthio, halogen, cyano, nitro, hydroxy, haloC1-C30 alkyl, C1-C30 alkylcarbonyl, or C1-C30 alkylcarbonyloxy, and the fused ring may include one or more heteroatoms selected from N, O, S, and Se; and Ar is benzodithiophenylene, benzodithienothiophenylene, naphthodithiophenylene, thiophenylene, benzothienoselenophenylene, benzodiselenophenylene, benzodiselenoselenophenylene, naphthodiselenophenylene, selenophenylene, or a combination thereof, and Ar may be independently of each other further substituted by one or more substituents selected from C1-C30 alkyl, C1-C30 alkoxy, C1-C30 alkylthio, C6-C30 aryl, C3-C30 heteroaryl, halogen, cyano, nitro, hydroxy, and a combination thereof.

In the polymer according to an exemplary embodiment of the present invention, the repeating unit [Ar] represented by Chemical Formula 2 may be selected from the following structures:

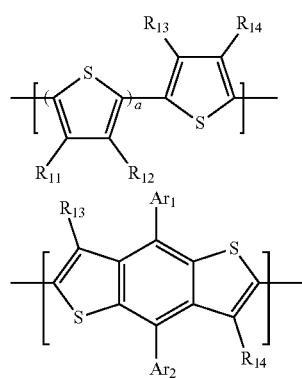

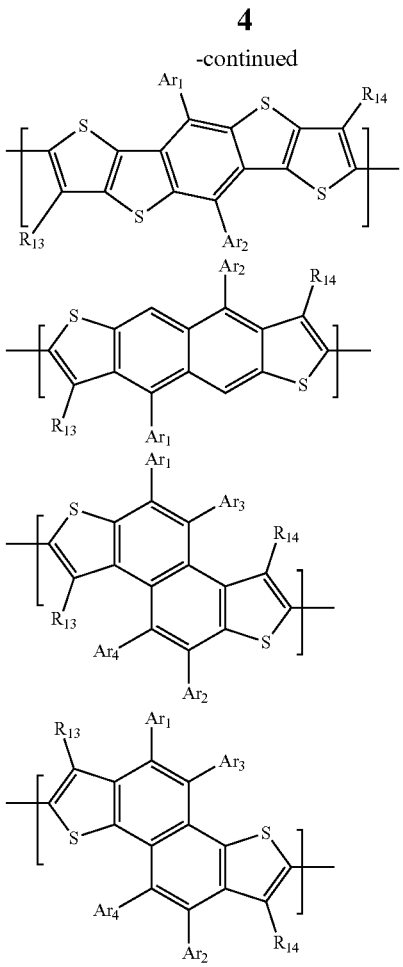

wherein a is selected from integers of 0 to 5;

R₁₁ and R₁₂ are independently of each other C1-C30 alkyl;

R₁₃ and R₁₄ are independently of each other hydrogen or C1-C30 alkyl; and

Ar₁ to Ar₄ are independently of one another hydrogen or C₃-C₃₀ heteroaryl, and the heteroaryl may further substituted by one or more substituents selected from C1-C30 alkyl, C1-C30 alkoxy, C1-C30 alkylthio, halogen, hydroxy, and a combination thereof.

In the polymer according to an exemplary embodiment of the present invention, Ar₁ and Ar₂ may be independently of each other C3-C30 heteroaryl substituted by one or more substituents selected from C1-C30 alkyl, halogen, or a combination thereof, and Ar₃ and Ar₄ may be hydrogen.

In the polymer according to an exemplary embodiment of the present invention, V₁ and V₂ may be independently of each other represented by the following Chemical Formula A:

[Chemical Formula A]

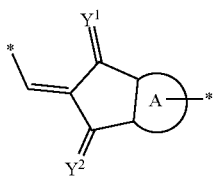

wherein

Y$_1$ and Y$_2$ are independently of each other O, S, or CR$_a$R$_b$, in which R$_a$ and R$_b$ are independently of each other halogen, cyano, nitro, hydroxy, C1-C30 alkylcarbonyl, or C1-C30 alkylcarbonyloxy; and A is a C6-C20 aromatic ring or C3-C20 heteroaromatic ring, and the aromatic ring and the heteroaromatic ring may be further substituted by one or more substituents selected from C1-C30 alkyl, C1-C30 alkoxy, C1-C30 alkylthio, halogen, cyano, haloC1-C30 alkyl, nitro, and hydroxy.

In the polymer according to an exemplary embodiment of the present invention, V1 and V2 may be independently of each other represented by the following Chemical Formula B or Chemical Formula C:

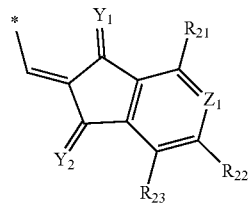

[Chemical Formula B]

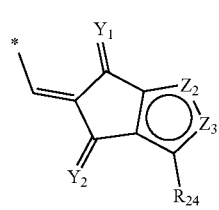

[Chemical Formula C]

wherein

Y$_1$ and Y$_2$ are independently of each other O, S, or CR$_a$R$_b$, in which R$_a$ and R$_b$ are independently of each other halogen, cyano, nitro, hydroxy, C1-C30 alkylcarbonyl, or C1-C30 alkylcarbonyloxy, and Y$_1$ and Y$_2$ are different from each other;

one of Z$_2$ and Z$_3$ is CR$_c$ and the other one is O, S, or Se, in which R$_c$ is hydrogen, C1-C30 alkyl, C1-C30 alkoxy, C1-C30 alkylthio, halogen, cyano, nitro, hydroxy, or haloC1-C30 alkyl;

Z$_1$ is CR$_d$ or N, in which R$_d$ is hydrogen, C1-C30 alkyl, C1-C30 alkoxy, C1-C30 alkylthio, halogen, cyano, nitro, hydroxy, or haloC1-C30 alkyl, or may be linked to R$_{21}$ or R$_{22}$ which is an adjacent substituent to form an aromatic fused ring; and R$_{21}$ to R$_{24}$ are independently of one another hydrogen, C1-C30 alkyl, C1-C30 alkoxy, C1-C30 alkylthio, halogen, cyano, nitro, hydroxy, or haloC1-C30 alkyl.

In the polymer according to an exemplary embodiment of the present invention, V$_1$ and V$_2$ may be independently of each other represented by the following Chemical Formula D, Chemical Formula E, Chemical Formula F, or Chemical Formula G:

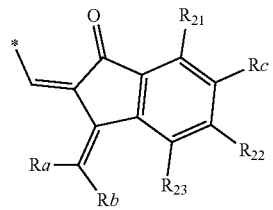

[Chemical Formula D]

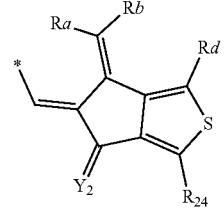

[Chemical Formula E]

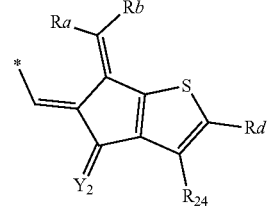

[Chemical Formula F]

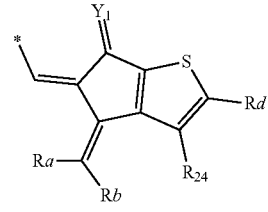

[Chemical Formula G]

wherein

Y$_1$ and Y$_2$ are independently of each other O or S;

R$_a$ and R$_b$ are independently of each other halogen, cyano, nitro, hydroxy, C1-C30 alkylcarbonyl, or C1-C30 alkylcarbonyloxy;

R$_c$ and R$_d$ are independently of each other hydrogen, C1-C30 alkyl, C1-C30 alkoxy, C1-C30 alkylthio, halogen, cyano, or haloC1-C30 alkyl; and R$_{21}$ to R$_{24}$ are independently of one another hydrogen, C1-C30 alkyl, C1-C30 alkoxy, C1-C30 alkylthio, halogen, cyano, or haloC1-C30 alkyl.

In the polymer according to an exemplary embodiment of the present invention, specifically, the polymer may include a repeating unit represented by the following Chemical Formula 3 and a repeating unit represented by the following Chemical Formula 4:

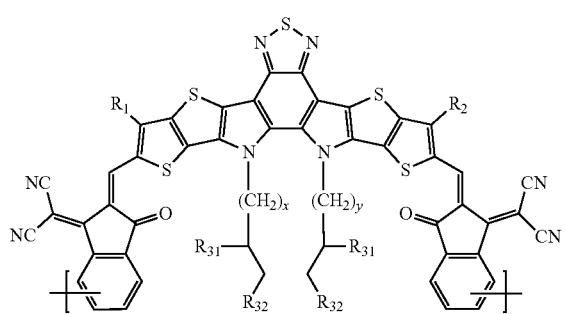

[Chemical Formula 3]

-continued

[Chemical Formula 4]

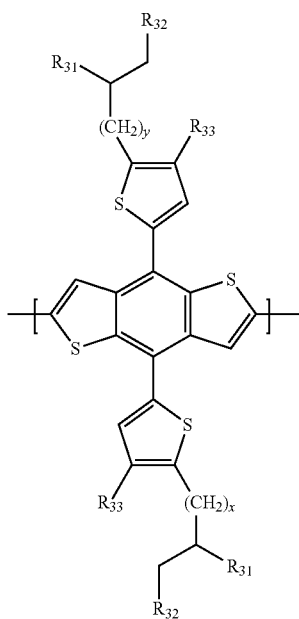

wherein $R_1$ and $R_2$ are independently of each other straight chain C8-C30 alkyl;

$R_{31}$ and $R_{32}$ are independently of each other branched chain C1-C7 alkyl;

x and y are independently of each other an integer selected from 1 to 7; and $R_{33}$ is independently of each other hydrogen, fluoro or chloro.

In the polymer according to an exemplary embodiment of the present invention, the polymer may satisfy 0<p<1, 0<q<1, and p+q=1, wherein p is a mole fraction of the repeating unit represented by Chemical Formula 1 and q is a mole fraction of the repeating unit represented by Chemical Formula 2.

In another general aspect, an organic electronic device includes the polymer according to an exemplary embodiment.

The organic electronic device according to an exemplary embodiment of the present invention may be an organic light emitting device, an organic thin film transistor, an organic photosensor, an organic solar cell, or the like, preferably, may be an organic solar cell.

In the organic electronic device according to an exemplary embodiment of the present invention, the polymer may be included in a photoactive layer of the organic solar cell, and preferably, may be included in the photoactive layer of the organic solar cell as an electron acceptor.

Advantageous Effects

The polymer according to the present invention has not only excellent chemical and thermal stability but also improved crystallinity to allow intermolecular stacking, by introducing a cyclic electron donor including thiophene, selenophene, or a combination thereof in a central skeleton. In addition, the polymer may not only form a bulk hetero junction with a relative electron donor material commonly used in an organic solar cell, that is, a known electron donor to be used as a photoactive layer material, but also provide a high-performance organic solar cell.

The polymer according to the present invention may adjust ratios of constituents of the polymer so as to have an optimal HOMO offset energy level, and may implement high efficiency and excellent stability of an organic solar cell adopting the polymer even with a relatively small use amount thereof. In addition, solubility and crystallinity are excellent even at a low temperature, oxidative stability is excellent, and when coating a solution including the polymer by spin coating, a slot die, or the like, pre-treatment and post-treatment are not required. Thus, the polymer allows a uniform thin film to be formed on a large area without a heat treatment process, and may be useful for practical use of a next-generation solar cell as a material appropriate for a roll-to-roll process.

In addition, the polymer according to the present invention has high compatibility with a known electron donor. When the polymer according to the present invention and a known electron donor are included in the photoactive layer, light may be effectively observed, holes and electrons may be easily separated, and the separated holes and electrons may be easily transferred. That is, an organic electronic device including the polymer according to the present invention in the photoactive layer implements high efficiency. Furthermore, the organic solar cell adopting the polymer according to the present invention may improve light efficiency and improve life characteristics of a device.

Due to the characteristics, the polymer of the present invention is used as a compound which may replace a fullerene derivative widely used as an electron acceptor, thereby significantly improving stability and efficiency of an organic solar cell. That is, the polymer of the present invention has very high availability as a non-fullerene-based electron acceptor.

BEST MODE

Figure 1:
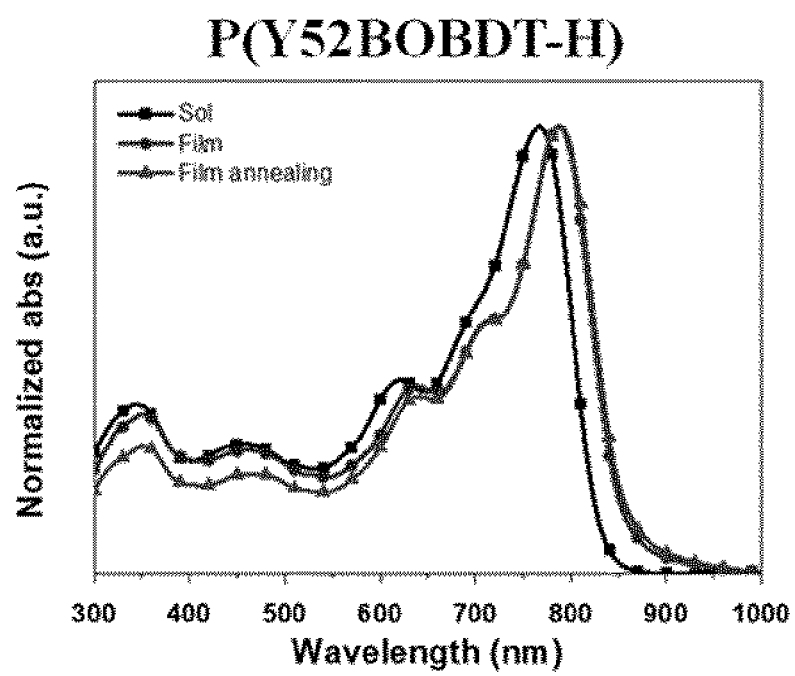
FIG. 1 is a UV-vis absorption spectrum on a solution and a film of a polymer (P(Y52BOBDT-H)) prepared in Example 1.

Hereinafter, a novel polymer according to the present invention and an organic electronic device using the same will be described, however, technical terms and scientific terms used herein have the general meaning understood by those skilled in the art to which the present invention pertains unless otherwise defined, and a description for the known function and configuration obscuring the present invention will be omitted in the following description.

It should be understood that in the present specification, unless otherwise required in the context, the terms "comprise" and "comprising" include a suggested step or constituent element, or a group of steps or constituent elements, but imply that any other step or constituent element or any group of steps or constituent groups is not excluded.

The terms "substituent", "radical", "group", "moiety", and "fragment" in the present specification may be used interchangeably.

The term "$C_A$-$C_B$" in the present specification refers to "the number of carbons being A or more and B or less".

The term "alkyl" in the present specification refers to a monovalent straight chain or branched chain saturated hydrocarbon radical composed of only carbon and hydrogen atoms. The alkyl includes, for example, methyl, ethyl, propyl, isopropyl, butyl, isobutyl, t-butyl, pentyl, hexyl, ethylhexyl, heptyl, octyl, nonyl, decyl, dodecyl, undecyl, and the like, but is not limited thereto.

The term "aryl" in the present specification refers to a monovalent organic radical of an aromatic ring derived from aromatic hydrocarbon by removal of one hydrogen, including a single- or fused ring system containing appropriately 4 to 7, preferably 5 or 6 ring atoms in each ring, and even a form in which a plurality of aryls is linked by a single bond. For example, phenyl, naphthyl, biphenyl, anthryl, indenyl, fluorenyl, and the like are included, but the present invention is not limited thereto.

The term "heteroaryl" in the present specification refers to an aryl group containing 1 to 4 heteroatoms selected from N, O, S, Se, and the like as an aromatic ring skeleton atom and carbon as a remaining aromatic ring skeleton atom, and is 5-or 6-membered monocyclic heteroaryl and polycyclic heteroaryl fused with one or more benzene rings. In addition, the heteroaryl in the present invention also includes a form in which one or more heteroaryls are linked by a single bond. For example, monocyclic heteroaryl such as furyl, thiophenyl, pyrrolyl, imidazolyl, pyrazolyl, thiazolyl, isothiazolyl, isoxazolyl, oxazolyl, and pyridyl, polycyclic heteroaryl such as benzofuranyl, dibenzofuranyl, dibenzothiophenyl, benzothiophenyl, isobenzofuranyl, benzimidazolyl, benzothiazolyl, benzoisothiazolyl, benzoisoxazolyl, benzoxazolyl, quinolyl, isoquinolyl, and carbozolyl, and the like are included, but the present invention is not limited thereto.

The term "alkoxy" in the present specification refers to an —O-alkyl radical, wherein "alkyl" is as described above. For example, methoxy, ethoxy, isopropoxy, butoxy, isobutoxy, t-butoxy, and the like are included, but the present invention is not limited thereto.

The term "alkylthio" in the present specification refers to a —S-alkyl radical, wherein "alkyl" is as defined above. For example, methylthio, ethylthio, isopropylthio, butylthio, isobutylthio, t-butylthio, and the like are included, but the present invention is not limited thereto.

The term "halo" or "halogen" in the present specification refers to a halogen group element, and for example, may be fluoro, chloro, bromo, or iodo.

The term "cyano" in the present specification refers to —CN, the term "nitro" refers to —$NO_2$, and the term "hydroxy" refers to —OH.

The term "haloalkyl" in the present specification refers to an alkyl radical in which one or more hydrogen atoms are replaced by a halogen atom, respectively, wherein "alkyl" and "halogen" are as defined above. For example, fluoromethyl, difluoromethyl, trifluoromethyl, fluoromethyl, difluoroethyl, perfluoroethyl, bromomethyl, bromoethyl, bromopropyl, and the like are included, but the present invention is not limited thereto.

The term "carbonyl" in the present specification refers to a divalent organic radical represented by *—C(=O)—*, and the term "thiocarbonyl" refers to a divalent organic radical represented by *—C(=S)—*.

The term "alkylcarbonyl" in the present specification refers to a —C(=O)-alkyl radical, wherein "alkyl" is as defined above. For example, methylcarbonyl, ethylcarbonyl, isopropylcarbonyl, propylcarbonyl, butylcarbonyl, isobutylcarbonyl, t-butylcarbonyl, and the like are included, but the present invention is not limited thereto.

The term "alkylcarbonyloxy" in the specification refers to an —OC(=O)alkyl radical, wherein "alkyl" is as described above. For example, methylcarbonyloxy, ethylcarbonyloxy, isopropylcarbonyloxy, propylcarbonyloxy, butylcarbonyloxy, isobutylcarbonyloxy, t-butylcarbonyloxy, and the like are included, but the present invention is not limited thereto.

The term "alkylene" in the present specification refers to a divalent straight chain or branched chain saturated hydrocarbon radical composed of only carbon and hydrogen atoms. For example, methylene, ethylene, propylene, isopropylene, butylene, isobutylene, t-butylene, pentylene, hexylene, heptylene, octylene, nonylene, and the like are included, but the present invention is not limited thereto.

Hereinafter, the polymer according to the present invention will be described in detail.

The polymer according to an exemplary embodiment of the present invention has a structure having minimized steric hindrance, excellent solubility and oxidative stability, and maximized charge carrier mobility, by having an A-D-A compound formed of a central electron donor unit (D) and an end electron acceptor unit (A) at both sides of the central electron donor unit (D) as a central skeleton and introducing an electron donor in an appropriate embodiment. Specifically, the polymer of the present invention may include repeating units represented by the following Chemical Formulae 1 and 2:

[Chemical Formula 1]

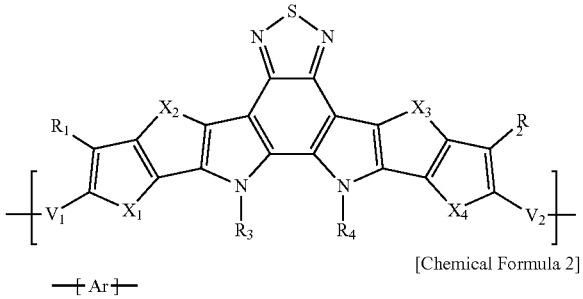

[Chemical Formula 2]

—[Ar]— wherein $R_1$ to $R_4$ are independently of one another C1-C30 alkyl;

$X_1$ to $X_4$ are independently of one another O, S, or Se;

$V_1$ and $V_2$ are independently of each other a fused ring having methylidene as a linking group, the fused ring may be independently of each other further substituted by one or more substituents selected from C1-C30 alkyl, C1-C30 alkoxy, C1-C30 alkylthio, halogen, cyano, haloC1-C30 alkyl, nitro, and hydroxy, —CH2— of the fused ring may be replaced with carbonyl, thiocarbonyl, or

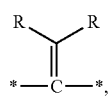

in which R is independently of each other hydrogen, C1-C30 alkyl, C1-C30 alkoxy, C1-C30 alkylthio, halogen, cyano, nitro, hydroxy, haloC1-C30 alkyl, C1-C30 alkylcarbonyl, or C1-C30 alkylcarbonyloxy, and the fused ring may include one or more heteroatoms selected from N, O, S, and Se; and Ar is benzodithiophenylene, benzodithienothiophenylene, naphthodithiophenylene, thiophenylene, benzothienoselenophenylene, benzodiselenophenylene, benzodiselenoselenophenylene, naphthodiselenophenylene, selenophenylene, or a combination thereof, and Ar may be independently of each other further substituted by one or more substituents selected from C1-C30 alkyl, C1-C30 alkoxy, C1-C30 alkylthio, C6-C30 aryl, C3-C30 heteroaryl, halogen, cyano, nitro, hydroxy, and a combination thereof.

The polymer according to the present invention has a structural characteristic described above, thereby showing a maximized charge carrier mobility, having high chemical and electrical stability, having high thermal stability, and having a high absorption coefficient to sunlight.

When the polymer according to the present invention is adopted as an electron acceptor, more improved efficiency may be shown, and thermal stability of an organic electronic device is increased. That is, the organic electronic device according to the present invention has excellent electrical properties and life characteristics.

In addition, the polymer according to the present invention has excellent solubility in an organic solvent and shows excellent compatibility with a known electron donor. Besides, the polymer forms a bulk heterojunction with the known electron donor to extremely improve the efficiency of the organic electronic device adopting the polymer. In particular, it was confirmed that the effect is significantly improved as compared with a monomer compound (e.g., Y5-2BO) which is conventionally used as an electron acceptor. Furthermore, the present invention is noted in that the organic electronic device adopting the polymer has excellent atmospheric stability, provides high performance even under room temperature and normal humidity conditions, and exerts an excellent effect in burn-in decomposition.

In addition, the organic electronic device according to the present invention, in particular, an organic solar cell, adopts the polymer as a non-fullerene-based electron acceptor, thereby implementing lowered driving voltage and improved power conversion efficiency and improving life characteristics.

In the polymer according to an exemplary embodiment of the present invention, the repeating unit [Ar] represented by Chemical Formula 2 may be selected from repeating units of the following structures:

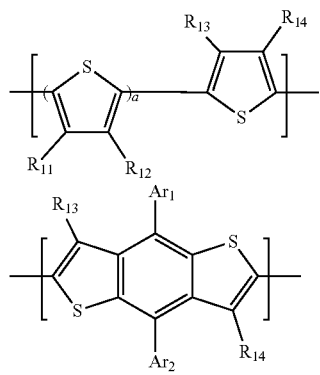
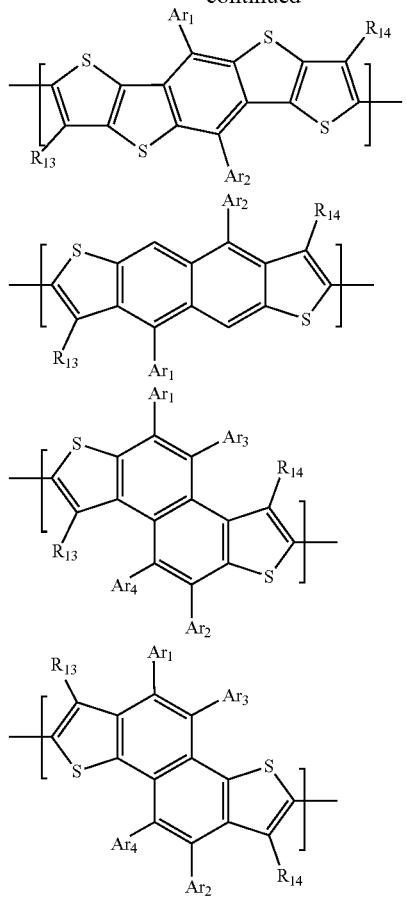

wherein
a is selected from integers of 0 to 5;
$R_{11}$ and $R_{12}$ are independently of each other C1-C30 alkyl;
$R_{13}$ and $R_{14}$ are independently of each other hydrogen or C1-C30 alkyl; and
$Ar_1$ to $Ar_4$ are independently of one another hydrogen or C3-C30 heteroaryl, and the heteroaryl may further substituted by one or more substituents selected from C1-C30 alkyl, C1-C30 alkoxy, C1-C30 alkylthio, halogen, hydroxy, and a combination thereof.

In the polymer according to an exemplary embodiment of the present invention, $Ar_1$ and $Ar_2$ may be independently of each other C3-C30 heteroaryl substituted by one or more substituents selected from C1-C30 alkyl, halogen, or a combination thereof, and $Ar_3$ and $Ar_4$ may be hydrogen.

As an example, in the polymer, $Ar_1$ and $Ar_2$ in the above structure may be C3-C30 heteroaryl substituted by at least one or more C1-C30 alkyl.

As an example, in the polymer, when $Ar_1$ and $Ar_2$ of the above structure are C3-C30 heteroaryl substituted by at least one or more C1-C30 alkyls wherein the heteroaryl is substituted by one halogen, surprisingly improved power conversion efficiency may be implemented.

The polymer according to an exemplary embodiment of the present invention has a structure to which a fused ring having methylidene as a linking group is introduced, for forming a conjugation extended to the outside of a central skeleton to further improve an intermolecular interaction. Specifically, the fused rings ($V_1$ and $V_2$) having methylidene as a linking group may be an electron acceptor unit, and these may be independently of each other represented by the following Chemical Formula A:

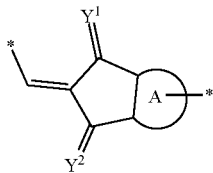

[Chemical Formula A]

wherein $Y_1$ and $Y_2$ are independently of each other O, S, or $CR_aR_b$, in which $R_a$ and $R_b$ are independently of each other halogen, cyano, nitro, hydroxy, C1-C30 alkylcarbonyl, or C1-C30 alkylcarbonyloxy; and A is a C6-C20 aromatic ring or C3-C20 heteroaromatic ring, and the aromatic ring and the heteroaromatic ring may be further substituted by one or more substituents selected from C1-C30 alkyl, C1-C30 alkoxy, C1-C30 alkylthio, halogen, cyano, haloC1-C30 alkyl, nitro, and hydroxy.

More specifically, the fused rings ($V_1$ and $V_2$) having methylidene as a linking group may be independently of each other represented by the following Chemical Formula B or Chemical Formula C:

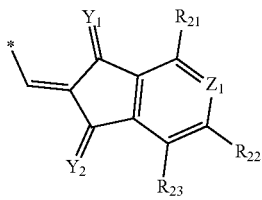

[Chemical Formula B]

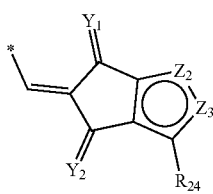

[Chemical Formula C]

wherein $Y_1$ and $Y_2$ are independently of each other O, S, or $CR_aR_b$, in which $R_a$ and $R_b$ are independently of each other halogen, cyano, nitro, hydroxy, C1-C30 alkylcarbonyl, or C1-C30 alkylcarbonyloxy, and $Y_1$ and $Y_2$ are different from each other;

one of $Z_2$ and $Z_3$ is $CR_c$ and the other one is O, S, or Se, in which $R_c$ is hydrogen, C1-C30 alkyl, C1-C30 alkoxy, C1-C30 alkylthio, halogen, cyano, nitro, hydroxy, or haloC1-C30 alkyl;

$Z_1$ is $CR_d$ or N, in which $R_d$ is hydrogen, C1-C30 alkyl, C1-C30 alkoxy, C1-C30 alkylthio, halogen, cyano, nitro, hydroxy, or haloC1-C30 alkyl, or may be linked to $R_{21}$ or $R_{22}$ which is an adjacent substituent to form an aromatic fused ring; and $R_{21}$ to $R_{24}$ are independently of one another hydrogen, C1-C30 alkyl, C1-C30 alkoxy, C1-C30 alkylthio, halogen, cyano, nitro, hydroxy, or haloC1-C30 alkyl.

More preferably, the fused rings ($V_1$ and $V_2$) having methylidene as a linking group may be independently of each other represented by the following Chemical Formula D, Chemical Formula E, Chemical Formula F, or Chemical Formula G:

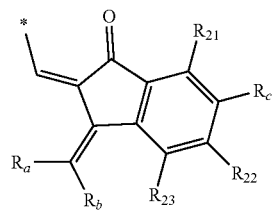

[Chemical Formula D]

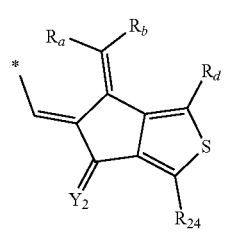

[Chemical Formula E]

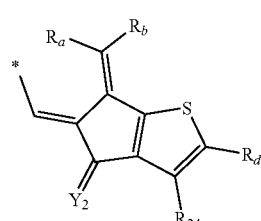

[Chemical Formula F]

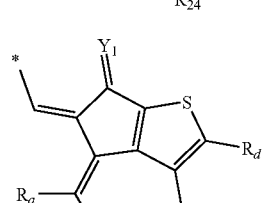

[Chemical Formula G]

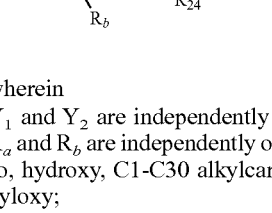

wherein $Y_1$ and $Y_2$ are independently of each other O or S;

$R_a$ and $R_b$ are independently of each other halogen, cyano, nitro, hydroxy, C1-C30 alkylcarbonyl, or C1-C30 alkylcarbonyloxy;

$R_c$ and $R_d$ are independently of each other hydrogen, C1-C30 alkyl, C1-C30 alkoxy, C1-C30 alkylthio, halogen, cyano, or haloC1-C30 alkyl; and $R_{21}$ to $R_{24}$ are independently of one another hydrogen, C1-C30 alkyl, C1-C30 alkoxy, C1-C30 alkylthio, halogen, cyano, or haloC1-C30 alkyl.

As an example, in Chemical Formulae D to G, $Y_1$ and $Y_2$ may be independently of each other O or S; $R_a$ and $R_b$ may be independently of each other halogen, cyano, nitro, hydroxy, C1-C7 alkylcarbonyl, or C1-C7 alkylcarbonyloxy; $R_c$ and $R_d$ may be independently of each other hydrogen, C1-C7 alkyl, C1-C7 alkoxy, C1-C7 alkylthio, halogen, cyano, or haloC1-C7 alkyl; $R_{21}$ to $R_{24}$ may be independently of one another hydrogen, C1-C7 alkyl, C1-C7 alkoxy, C1-C7 alkylthio, halogen, cyano, or haloC1-C7 alkyl.

As an example, in Chemical Formulae D to G, $Y_1$ and $Y_2$ may be independently of each other O or S; $R_a$ and $R_b$ may be independently of each other halogen, cyano, C1-C7 alkylcarbonyl, or C1-C7 alkylcarbonyloxy; $R_c$ and $R_d$ may be independently of each other hydrogen, C1-C7 alkyl, C1-C7 alkoxy, halogen, cyano, or haloC1-C7 alkyl; $R_{21}$ to $R_{24}$ may be independently of one another hydrogen, C1-C7 alkyl, C1-C7 alkoxy, halogen, cyano, or haloC1-C7 alkyl.
As an example, the fused ring (V1 and V2) having methylidene as a linking group may be selected from the following structures, but is not limited thereto.
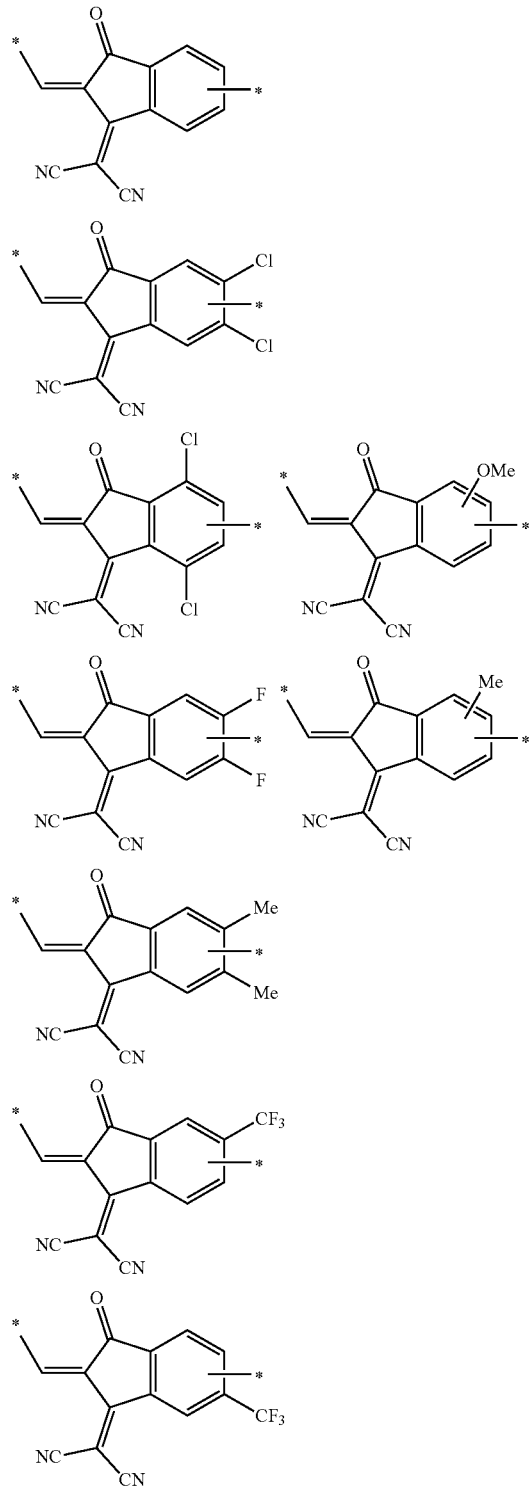
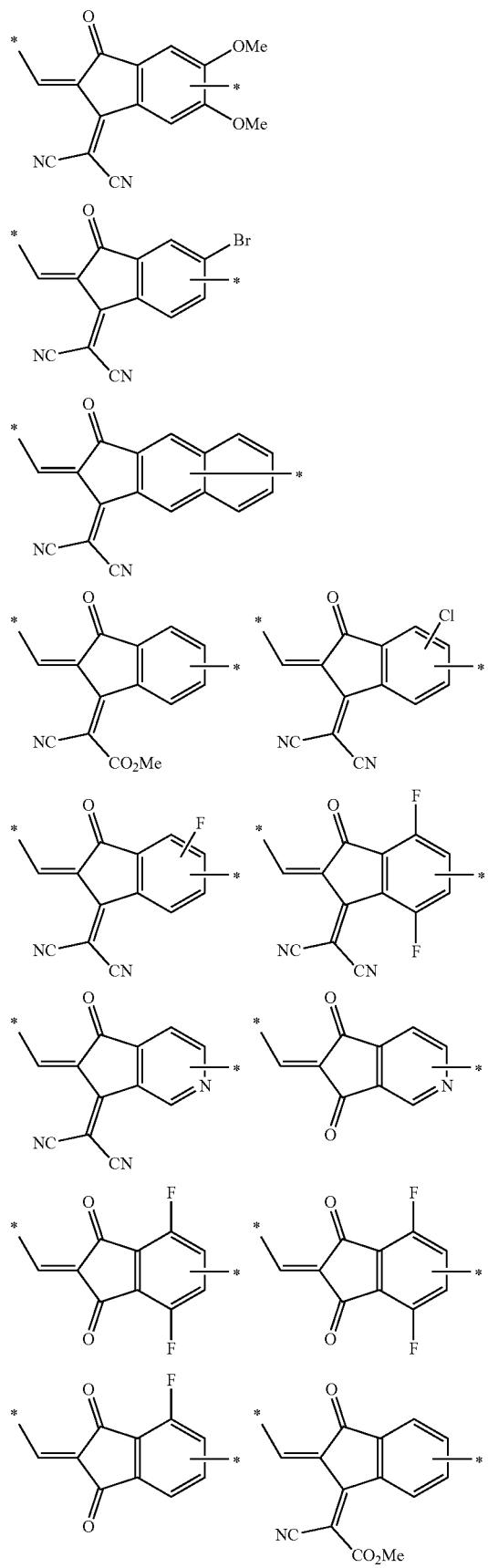

-continued

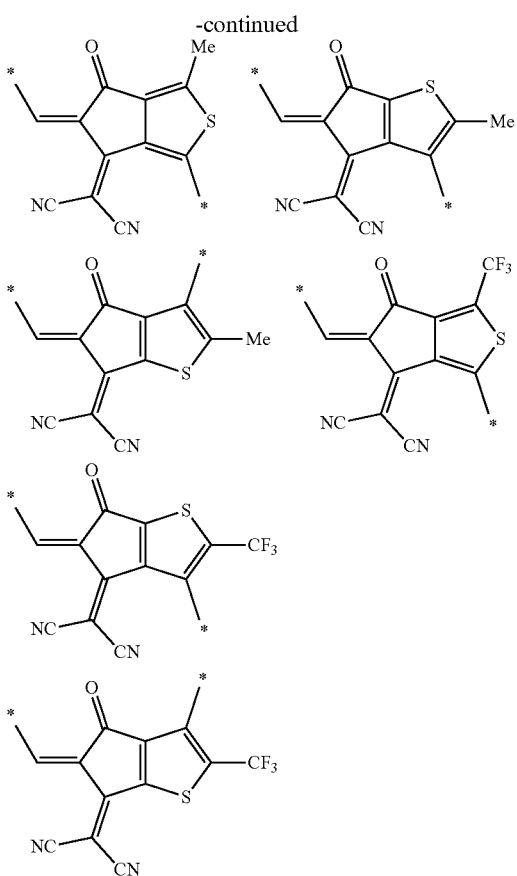

-continued

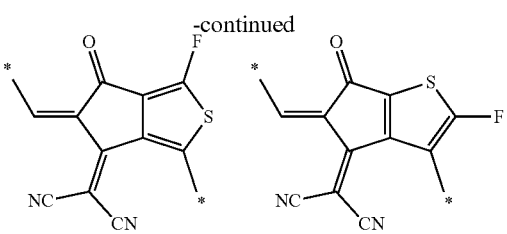

The polymer according to the present invention has less energy loss due to absorption of sunlight to implement a higher absorption coefficient by sunlight, by minimizing quenching in an excited state by a vibronic path by the structural characteristics described above. In addition, the polymer has higher crystallinity to allow implementation of high charge carrier mobility.

As an example, in the polymer, $X_1$ to $X_4$ may be independently of one another O or S.

As an example, in the polymer, $X_1$ to $X_4$ may be identical to each other.

As an example, in the polymer, $X_1$ to $X_4$ may be all S.

As an example, in the polymer, $X_1$ to $X_4$ may be all O.

As an example, in the polymer, $X_1$ and $X_4$ may be identical to each other, and $X_2$ and $X_3$ may be identical to each other.

As an example, in the polymer, $X_1$ and $X_4$ may be S, and $X_2$ and $X_3$ may be O.

As an example, in the polymer, $X_1$ and $X_4$ may be O, and $X_2$ and $X_3$ may be S.

The polymer according to an exemplary embodiment of the present invention may include a repeating unit represented by the following Chemical Formula 3 and a repeating unit represented by the following Chemical Formula 4:

[Chemical Formula 3]

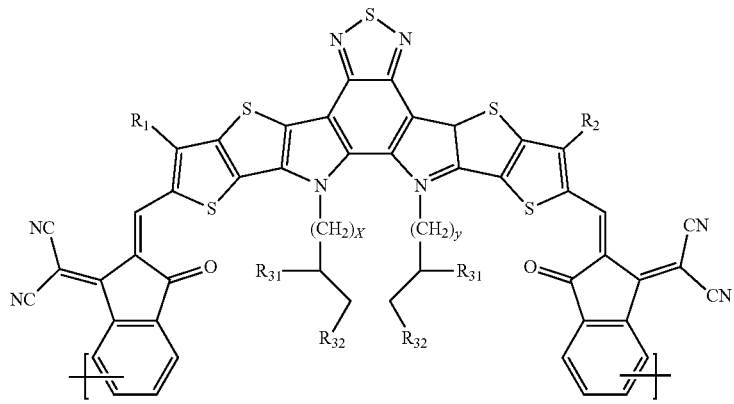

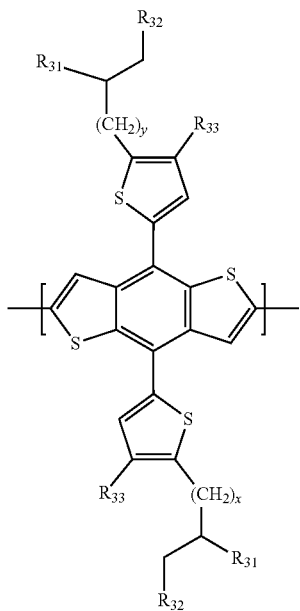

wherein $R_1$ and $R_2$ are independently of each other straight chain C8-C30 alkyl;

$R_{31}$ and $R_{32}$ are independently of each other branched chain C1-C7 alkyl;

x and y are independently of each other an integer selected from 1 to 7; and $R_{33}$ is independently of each other hydrogen, fluoro or chloro.

More preferably, an electron donating region includes a long chain branched alkyl group as in the repeating unit represented by Chemical Formula 4, in terms of improving not only electron donation but also solubility.

As an example, $R_{31}$ and $R_{32}$ may be independently of each other C1-C7 alkyl, and $R_{33}$ may be independently of each other fluoro or chloro. In addition, $R_{33}$ is preferably chloro.

The polymer according to an exemplary embodiment of the present invention may be most preferably selected from the following structures, but is not limited thereto:

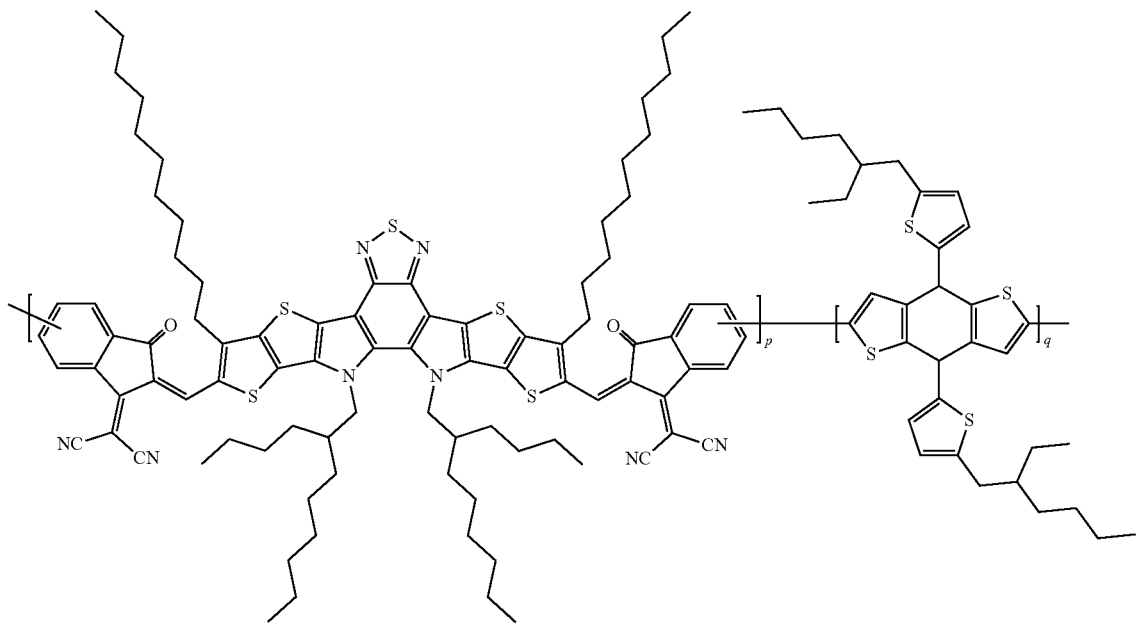

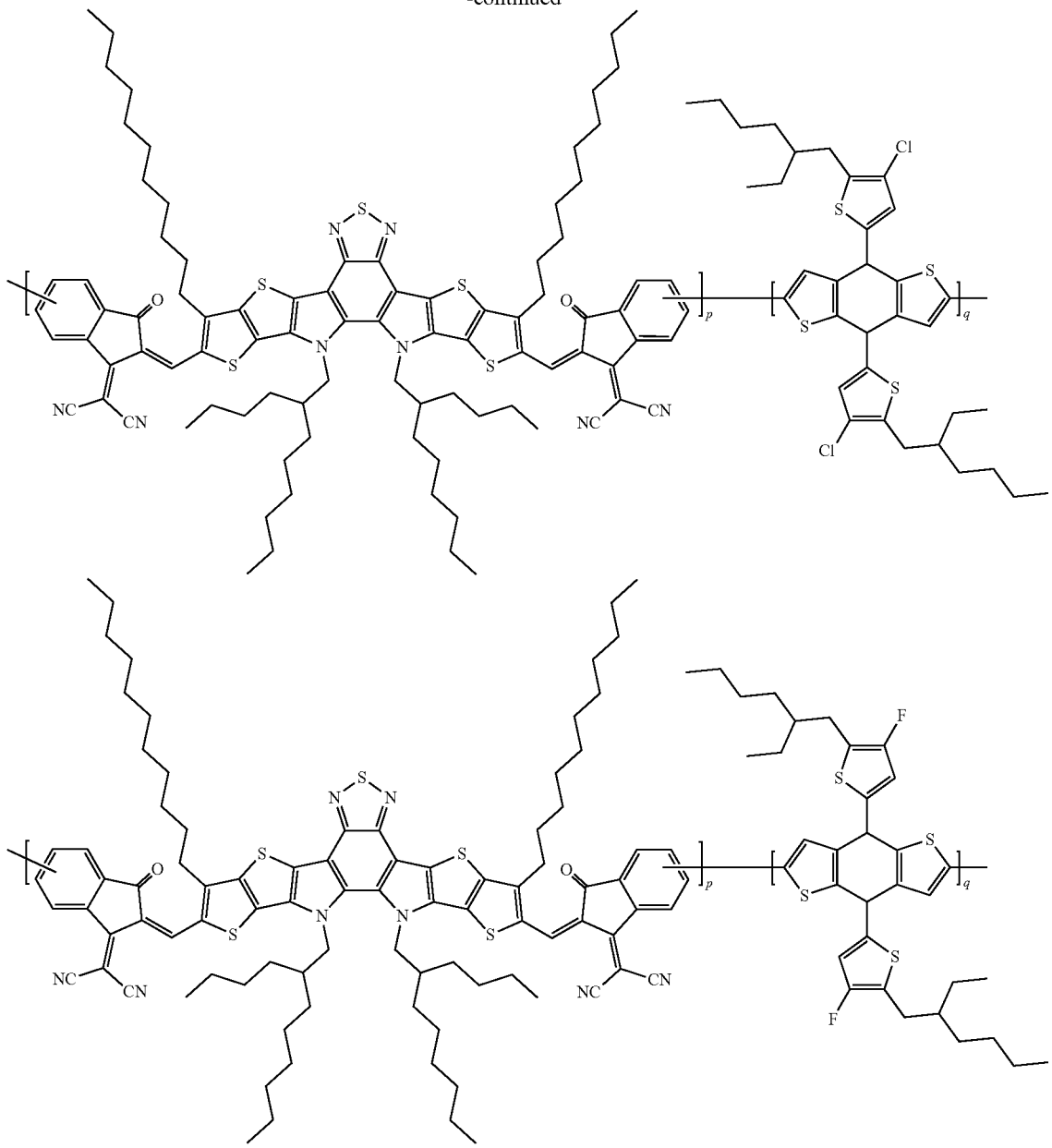

-continued wherein p and q are mole fractions of each repeating unit.

The polymer according to an exemplary embodiment of the present invention may satisfy 0<p<1, 0<q<1, and p+q=1, wherein p is a mole fraction of the repeating unit represented by Chemical Formula 1 and q is a mole fraction of the repeating unit represented by Chemical Formula 2.

The polymer according to an exemplary embodiment of the present invention may be 30 kDa to 1,000 kDa, 30 kDa to 1,000 kDa, 40 kDa to 1,000 kDa, 50 kDa to 1,000 kDa, 60 kDa to 1,000 kDa, 70 kDa to 1,000 kDa, 100 kDa to 1,000 kDa, 30 kDa to 800 kDa, 40 kDa to 800 kDa, 50 kDa to 800 kDa, 60 kDa to 800 kDa, 70 kDa to 800 kDa, 100 kDa to 800 kDa, 30 kDa to 500 kDa, 40 kDa to 500 kDa, 50 kDa to 500 kDa, 60 kDa to 500 kDa, 70 kDa to 500 kDa, 100 kDa to 500 kDa, 30 kDa to 250 kDa, 40 kDa to 250 kDa, 50 kDa to 250 kDa, 60 kDa to 250 kDa, 70 kDa to 250 kDa, 100 kDa to 250 kDa, 30 kDa to 150 kDa, 40 kDa to 150 kDa, 50 kDa to 150 kDa, 60 kDa to 150 kDa, 70 kDa to 150 kDa, or 50 kDa to 100 kDa. Here, the molecular weight is provided as a number average molecular weight $M_n$ measured by gel permeation chromatography (GPC) for a polystyrene standard. Here, a polymerization degree (n) refers to a number average polymerization degree provided as $n=M_n/M_u$ (wherein $M_n$ is a number average molecular weight and $M_u$ is a molecular weight of a single repeating unit).

The polymer according to an exemplary embodiment of the present invention may be included in the organic electronic device, and especially, may be used as an electron acceptor material in the photoactive layer of an organic solar cell to replace a conventional fullerene derivative, thereby implementing improved power conversion efficiency in the organic solar cell. Thus, the organic solar cell according to the present invention may implement high performance with a non-fullerene-based electron acceptor material having excellent efficiency and stability.

The polymer according to an exemplary embodiment of the present invention may be prepared by a common organic synthesis method, an organic solvent used thereto is not limited, and reaction time and temperature may be also changed within the range which does not depart the gist of the invention, of course.

In addition, the present invention provides an organic electronic device including the polymer described above.

The organic electronic device according to an exemplary embodiment of the present invention is not limited as long as the polymer of the present invention may be used, and a non-limiting example thereof may include an organic solar cell, an organic thin film transistor, an organic memory, an organic photoreceptor, an organic photosensor, or the like, preferably may be an organic solar cell or an organic thin film transistor, and more preferably an organic solar cell.

The organic electronic device according to an exemplary embodiment of the present invention is an organic solar cell, and may include the polymer in the photoactive layer of the organic solar cell.

More specifically, the polymer of the present invention is used as an alternative compound of a fullerene derivative which is conventionally used in the organic solar cell as an electron acceptor, and thus, the organic solar cell adopting the polymer has improved power conversion efficiency.

Hereinafter, a method of manufacturing an organic solar cell according to the present invention will be described with an example, but it is not limited thereto.

The organic solar cell is formed of a structure in which a hole transport layer and an electron transport layer are joined, and a power conversion effect is shown by a process in which when sunlight is absorbed, an electron-hole pair is produced in a hole acceptor and electrons are moved to an electron acceptor to a separate electron-hole.

It was confirmed that the polymer of the present invention is adopted in the organic solar cell, thereby achieving surprisingly improved power conversion efficiency. In addition, the polymer of the present invention has high crystallinity and solubility to have high charge carrier mobility, and thus, may be used in the photoactive layer of the organic solar cell as an electron acceptor to implement high efficiency.

The organic solar cell according to an exemplary embodiment of the present invention may include a substrate, a first electrode, a photoactive layer, and a second electrode, and may further include a hole transport layer, an electron transport layer, and the like, of course.

In addition, the organic solar cell according to an exemplary embodiment of the present invention may be an inverted type organic solar cell.

The substrate may be made of a flexible and transparent material such as a plastic including polyethylene terephthalate (PET), polyethylene naphthalate (PEN), polypropylene (PP), polyimide (PI), polycarbonate (PC), polystyrene (PS), polyoxyethylene (POM), acrylonitrile styrene copolymer (AS resin), acrylonitrile butadiene styrene copolymer (ABS resin), triacetyl cellulose (TAC), and the like, in addition to glass and a quartz plate.

In addition, the first electrode is formed by applying a transparent electrode material on one surface of the substrate or coating the substrate in the form of a film, using sputtering, E-Beam, thermal deposition, spin coating, screen printing, inkjet printing, doctor blade, or a gravure printing method. The first electrode functions as an anode and has a higher work function than the second electrode, and any transparent conductive material may be used. For example, indium tin oxide (ITO), gold, silver, fluorine-doped tin oxide (FTO), aluminum-doped zinc oxide (AZO), indium zinc oxide (IZO), $ZnO-Ga_2O_3$, $ZnO-Al_2O_3$, antimony tin oxide (ATO, $SnO_2-Sb_2O_3$), and the like may be used, and preferably ITO may be used.

The photoactive layer is formed of a mixture of an electron acceptor and an electron donor, may provide a photoelectromotive force effect with very rapid charge transfer and separation phenomenon, include the polymer of the present invention as an electron acceptor, and a blended amount thereof may be appropriately adjusted depending on the use. In addition, the polymer of the present invention is dissolved in an organic solvent and may be used as an electron acceptor material of the photoactive layer at a thickness of 60 mm or more, preferably 60 to 120 mm. In addition, an example of the electron donor may include poly[(2,6-(4,8-bis(5-(2-ethylhexyl)thiophen-2-yl)-benzo[1,2-b:4,5-b']dithiophene))-alt-(5,5-(1',3'-di-2-thienyl-5',7'-bis(2-ethylhexyl)benzo[1',2'-c:4',5'-c']dithiophene-4,8-dione))] (PBDB-T), poly[(2,6-(4,8-bis(5-(2-ethylhexylthio)thiophen-2-yl)-benzo[1,2-b:4,5-b']dithiophene))-alt-(5,5-(1',3'-di-2-thienyl-5',7'-bis(2-ethylhexyl)benzo[1',2'-c:4',5'-c']dithiophene-4,8-dione))] (PBDB-T-S), poly[(2,6-(4,8-bis(5-(2-ethylhexylthio)-4-fluorothiophen-2-yl)-benzo[1,2-b:4,5-b']-dithiophene))-alt-(5,5-(1',3'-di-2-thienyl-5',7'-bis(2-ethylhexyl)benzo[1',2'-c:4',5'-c']dithiophene-4,8-dione)] (PBDB-T-SF), poly[(2,6-(4,8-bis(5-(2-ethylhexyl)-4-fluorothiophen-2-yl)-benzo[1,2-b:4,5-b']dithiophene))-alt-(5,5-(1',3'-di-2-thienyl-5',7'-bis(2-ethylhexyl)benzo[1',2'-c:4',5'-c']dithiophene-4,8-dione)] (PBDB-T-2F), poly[(4,8-bis(5-(2-ethylhexyl)thiophen-2-yl)-benzo[1,2-b;4,5-b']dithiophene)-2,6-diyl-alt-(4-(2-ethylhexanoyl)-thieno[3,4-b]thiophene))-2,6-diyl] (PBDTTT-C-T), poly[1-(6-{4,8-bis[(2-ethylhexyl)oxy]-6-methylbenzo[1,2-b:4,5-b']dithiophen-2-yl}-3-fluoro-4-methylthieno[3,4-b]thiophen-2-yl)-1-octanone] (PBDTTT-C-F), poly[(5,6-difluoro-2-octyl-2H-benzotriazole-4,7-diyl)-2,5-thiophenediyl[4,8-bis[5-(2-hexyldecyl)-2-thienyl]benzo[1,2-b:4,5-b']dithiophene-2,6-diyl]-2,5-thiophenediyl] (J51), poly{2,6'-4,8-di(5-ethylhexylthienyl)benzo[1,2-b;3,4-b]dithiophene-alt-5-dibutyloctyl-3,6-bis(5-bromothiophen-2-yl)pyrrolo[3,4-c]pyrrole-1,4-dione} (PBDTT-DPP), poly(3-hexylthiophene) (P3HT), poly[N-9'-heptadecanyl-2,7-carbazole-alt-5,5-(4',7'-di-2-thienyl-2',1',3'-benzothiadiazole)] (PCDTBT), and the like. The electron donor and the polymer of the present invention are blended at a weight ratio of 1:0.5 to 1:4 and dissolved in an organic solvent, and the solution may form the photoactive layer by a method such as spin coating, spray coating, screen printing, and a doctor blade method. The organic solvent is a single organic solvent or two or more organic solvents having different boiling points from each other, and specifically, may be one or more organic solvents selected from the group consisting of chlorobenzene, acetone, methanol, tetrahydrofuran, toluene, xylene, tetralin, 1,2-dichlorobenzene, and chloroform.

The photoactive layer uses the polymer of the present invention as an electron acceptor, and since the state change thereof is not observed even under a wide range of temperature conditions, the photoactive layer may have excellent performance and morphology. In addition, in order to adjust the morphology and crystallinity of the photoactive layer, an additional additive may be further included. An example of the additive may include 1,8-diiodooctane (DIO), 1-chloronaphthalene (1-CN), diphenylether (DPE), octane dithiol, tetrabromothiophene, and the like, and may be appropriately blended depending on its use.

In addition, the photoactive layer including the polymer according to the present invention has increased short circuit current density and open circuit voltage due to a high electron density to improve power conversion efficiency. That is, the polymer according to the present invention is used as an alternative compound of a fullerene derivative which is conventionally used in an organic solar cell as an electron acceptor, and the organic solar cell adopting the polymer has improved power conversion efficiency.

In addition, the second electrode may be deposited using a thermal evaporator in a state in which an electron transport layer is introduced. Here, a usable electrode material may be selected from lithium fluoride/aluminum, lithium fluoride/calcium/aluminum, aluminum/calcium, barium fluoride/aluminum, barium fluoride/barium/aluminum, barium/aluminum, aluminum, gold, silver, magnesium:silver, and lithium:aluminum, and it is preferred to use an electrode manufactured with a silver, aluminum, aluminum/calcium, or barium fluoride/barium/aluminum structure.

In addition, the materials of an electron transport layer and a hole transport layer may be used unlike a general type of electron transport layer and hole transport layer. An example of the electron transport layer material may include $TiO_x$, ZnO, $TiO_2$, $ZrO_2$, MgO, $HfO_2$, and the like, and an example of the hole transport layer material may include metal oxides such as NiO, $Ta_2O_3$, $MoO_3$, and $Ru_2O_3$. In addition, an organic conjugated polymer electrolyte having cations or anions together with the metal oxides described above may be used as the electron transport layer or hole transport layer material, of course.

Hereinafter, the present invention will be described in detail by Examples. However, the following Examples are only illustrative of the present invention, and the disclosure of the present invention is not limited by the following Examples. The technical and scientific terms used herein have, unless otherwise defined, the meaning commonly understood by those of ordinary skill in the art. Further, repeated description of the same technical structure and operation as the prior art will be omitted.

Example 1

Preparation of P(Y52BOBDT-H)
Step 1: Preparation of compound (2)

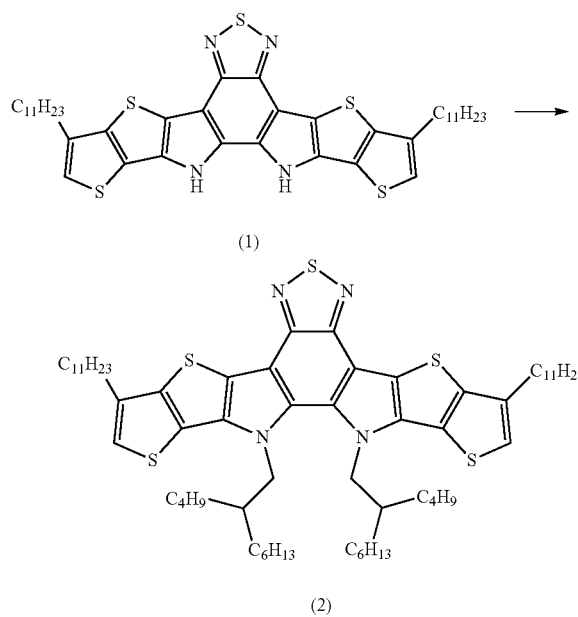

Compound (1) (8.1 g, 10.8 mmol) was introduced to a three-necked flask, 5-(bromomethyl)undecane (3.72 g, 15 mmol), potassium hydroxide (2 g, 35.64 mmol), and dimethyl formamide (DMF) were added thereto, and oxygen was removed for 15 minutes by argon gas. The mixture was refluxed at 80° C. for 15 hours. Thereafter, the solvent was removed and extraction was performed using ethyl acetate and distilled water ($H_2O$). An organic layer was dried with $MgSO_4$, and then column chromatography was performed. The column chromatography was performed with dichloromethane:petroleum ether=1:1 (vol:vol), and a red solid compound (2) was obtained (4.7 g, 40%).

$^1$H NMR (300 MHz, C4D20) δ 8.96 (s, 1H), 6.49 (d, J=7.7 Hz, 2H), 4.61 (t, J=7.6 Hz, 2H), 3.88 (s, 1H), 3.80-3.56 (m, 2H), 3.34-2.96 (m, 17H), 2.99-2.49 (m, 18H), 2.50-2.24 (m, 8H).

Step 2: Preparation of compound (3)

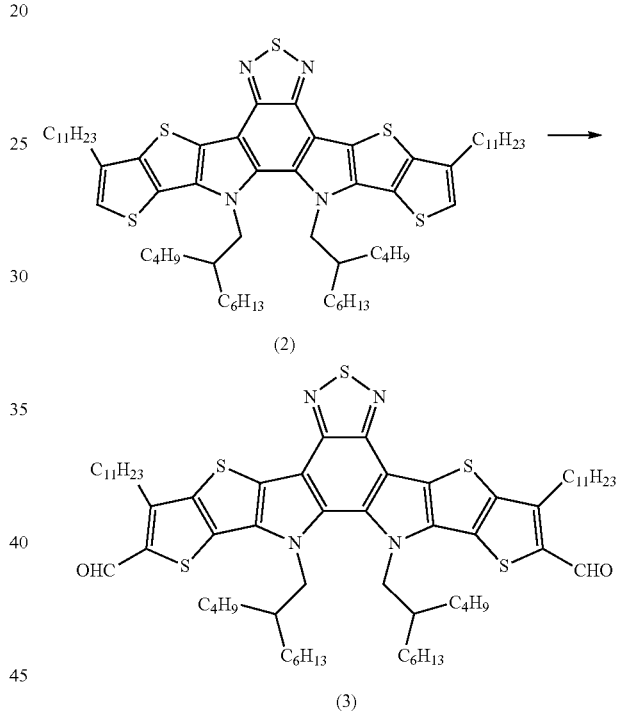

To a solution of compound (2) (0.46 g, 0.5 mmol) dissolved in tetrahydrofuran (THF), n-BuLi (0.69 ml, 1.6 M in hexane) was slowly added at −78° C. in a nitrogen state. Thereafter, the solution was stirred at the same temperature for 1.5 hours and then stirred at 0° C. for 0.5 hours. The mixed solution was cooled down to −78° C. and then DMF was added. The solution was allowed to come to room temperature (25° C.) and then stirred for 12 hours. Water was poured thereto, and then extraction was performed using dichloromethane. An organic layer was dried with $MgSO_4$, and then column chromatography was performed. The column chromatography was performed with dichloromethane:petroleum ether=1:1 (vol:vol), and a red solid compound (3) was obtained (0.34 g, 60%).

$^1$H NMR (300 MHz, CD2C12) δ 10.06 (s, 1H), 4.74-4.37 (m, 2H), 3.13 (t, J=7.6 Hz, 2H), 2.04-1.91 (m, 1H), 1.90-1.77(m, 2H), 1.44-1.12 (m, 17H), 1.08-0.65 (m, 18H), 0.63-0.46 (m, 8H).

Step 3: Preparation of compound (4)

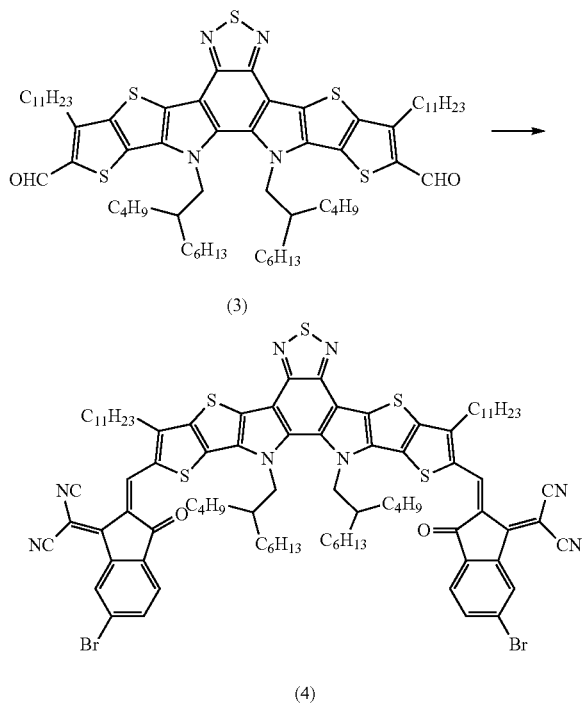

Compound (3) (0.17 g, 0.15 mmol), 2-(6-bromo-3-oxo-2,3-dihydro-1H-inden-1-ylidene)malononitrile (0.25 g, 0.91 mmol), pyridine (1 ml), and chloroform (45 ml) were placed in a nitrogen stream round bottom flask. The mixed solution was stirred at 65° C. for 12 hours. The temperature was raised to room temperature, methanol was poured thereto, and filtering was performed. Column chromatography was performed with silica gel. Column chromatography was performed with dichloromethane:petroleum ether=1:1 (vol:vol), and a dark blue solid compound (4) was obtained (0.14 g, 57%).

$^1$H NMR (300 MHz, CD2C12) δ 9.07-8.90 (m, 2H), 8.67 (s, 1H), 8.42 (d, J=8.5 Hz, 1H), 7.96 (d, J=1.9 Hz, 1H), 7.83 (dd, J=8.0, 1.4 Hz, 1H), 7.78 (dd, J=8.4, 1.9 Hz, 1H), 7.72 (d, J=8.0 Hz, 1H), 4.76 (d, J=7.2 Hz, 4H), 3.11 (s, 4H), 2.17 (s, 2H), 1.77 (dd, J=14.4, 7.4 Hz, 4H), 1.49-1.33 (m, 4H), 1.36-0.69 (m, 68H), 0.69-0.49 (m, 12H).

Step 4: Preparation of P(Y52BOBDT-H): polymer 1

Compound (4) (200 mg, 0.121 mmol), (4,8-bis(5-(2-ethylhexyl)thiophen-2-yl)benzo[1,2-b:4,5-b']dithiophene-2,6-diyl)bis(trimethylstannane) (109 mg, 0.121 mmol), Pd$_2$(dba)$_3$ (2.4 mg, 0.0026 mmol), and P(o-tol)$_3$ (3.2 mg, 0.011 mmol) were placed in a 50 ml two-necked flask. The mixture was reacted at 85° C. for 12 hours and then cooled down to room temperature, and the reaction mixture was poured to methanol (200 ml). The precipitate was filtered, and Soxhlet was used to perform extraction in an order of methanol, dichloromethane, and chloroform. Extracted chloroform was concentrated, precipitated in 200 ml of methanol, and filtered. This was dried under vacuum to obtain polymer 1 which was a dark solid (160 mg, 63%) ($M_n$=12 kg mol$^{-1}$, PDI=1.6, p=0.5).

$^1$H NMR (300MHz, CDC13) δ9.26-8.65 (broad, 4H), 8.2-7.8(broad, 4H), 7.82-7.51 (broad, 6H), 4.85-4.65 (m, 4H), 3.22-3.03 (m, 4H), 2.97-2.81 (m, 4H), 1.9 (m, 4H), 1.84 (m, 2H), 1.55 (m, 4H), 1.45-0.88 (m, 82H), 0.98-0.52 (m, 24H)).

Examples 2 to 4

Polymers in the following Table 1 were obtained in the same manner as in Example 1, except that monomer compounds in Table 1 were used instead of (4,8-bis(5-(2-ethylhexyl)thiophen-2-yl)benzo[1,2-b:4,5-b']dithiophene-2,6-diyl)bis(trimethylstannane) in step 4.

TABLE 1

| Example No. | Monomer compound | Polymer No. |
|---|---|---|
| Example 2 | (structure shown) | Dark solid polymer 2: P(Y52BOBDT-F, p = 0.5), (173 mg. 66%) (Mn = 14 kg mol$^{-1}$, PDI = 1.8), $^1$H NMR (300 MHz, CDCl3) δ 9.26-8.65 (broad, 4H), 8.2-7.8 (broad, 4H), 7.82-7.51 (broad, 4H), 4.81-4.65 (m, 4H), 3.25-3.03 (m, 4H), 2.92-2.82 (m, 4H), 1.91 (m, 4H), 1.84 (m, 2H), 1.56 (m, 4H), 1.45-0.89 (m, 82H), 0.98-0.52 (m, 24H). |

TABLE 1-continued

| Example No. | Monomer compound | Polymer No. |
|---|---|---|
| Example 3 | (structure shown) | Dark solid polymer 3: P(Y52BOBDT-Cl, p = 0.5), (172 mg, 68%) (Mn = 12 kg mol$^{-1}$, PDI = 1.8). $^1$H NMR (300 MHz, CDCl3) δ 9.21-8.67 (broad, 4H), 8.25-7.83 (broad, 4H), 7.82-7.51 (broad, 4H), 4.83-4.65 (m, 4H), 3.23-3.02 (m, 4H), 2.99-2.81 (m, 4H), 1.9 (m, 4H), 1.84 (m, 2H), 1.56 (m, 4H), 1.45-0.89 (m, 82H), 0.98-0.52 (m, 24H). |
| Example 4 | (structure shown) | Dark blue solid polymer 4: S-6-Th(p = 0.5), (55%) |

Figure 2:
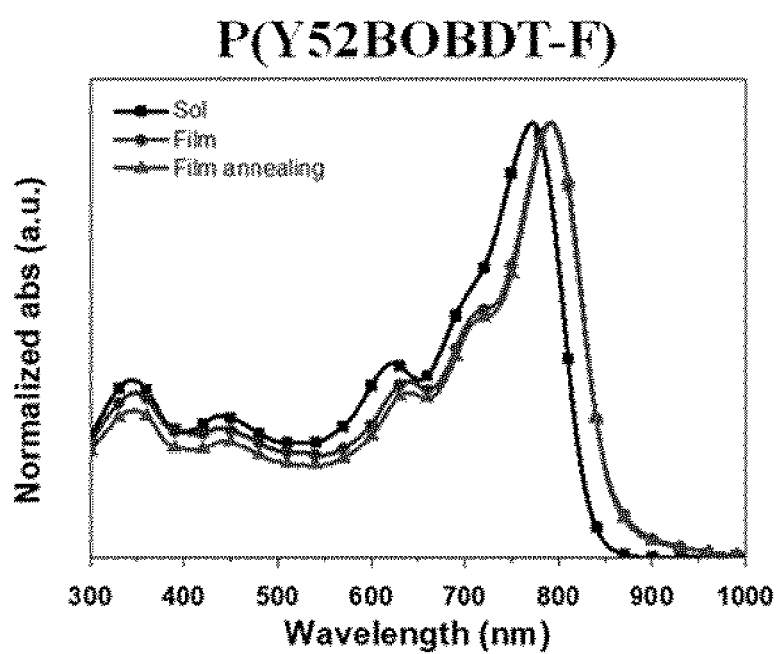
FIG. 2 is a UV-vis absorption spectrum on a solution and a film of a polymer (P(Y52BOBDT-Cl)) prepared in Example 2.
Figure 3:
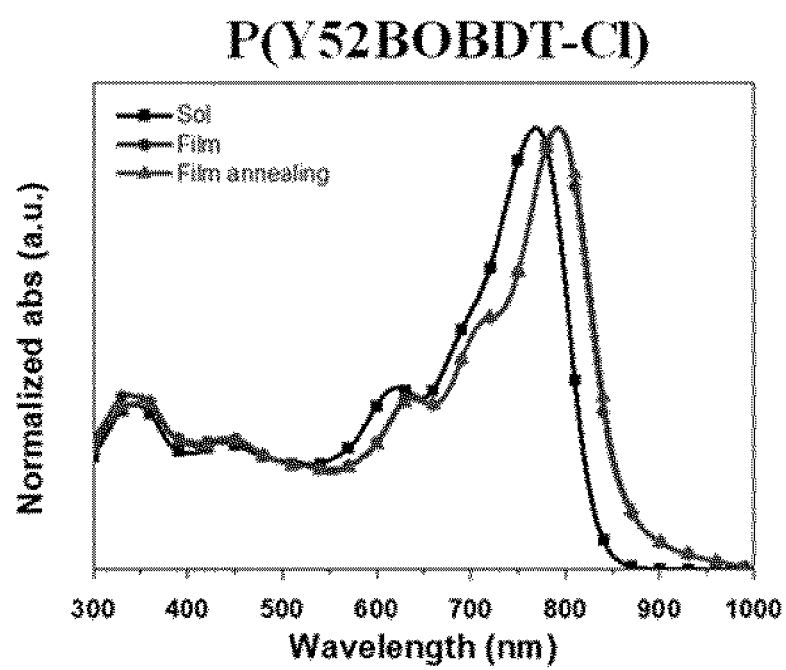
FIG. 3 is a UV-vis absorption spectrum on a solution and a film of a polymer (P(Y52BOBDT-F)) prepared in Example 3.
Figure 4:
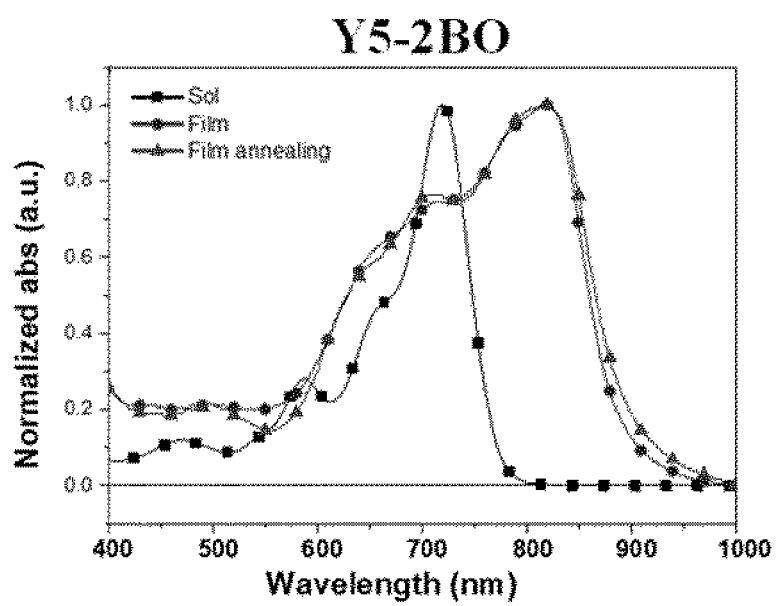
FIG. 4 is a UV-vis absorption spectrum on a solution and a film of an electron acceptor compound (Y5-2BO) used in Comparative Example 1.

Light absorption regions of the polymers prepared in Examples 1 to 3 were measured in a solution state (solution: CHCl$_3$) and in a film state, and the results are shown in FIGS. 1 to 3. In addition, the optical properties of the polymers prepared in Examples 1 to 3 are shown in the following Table 2, and the band gap (Eg) was determined in a UV absorption wavelength in a film state.

TABLE 2

|  | Polymer 1 (Example 1) | Polymer 2 (Example 2) | Polymer 3 (Example 3) | Y5-2BO |
|---|---|---|---|---|
| UV-Sol. CHCl$_3$ max. (nm) | 767 | 7472 | 769 | 718 663(s) |
| UV-Film rt. max. (nm) | 788 | 892 | 793 | 818 711(s) |
| 100° C. | 788 | 792 | 793 | 815 713(s) |
| UV-Sol. CHCl$_3$ $\lambda_{edge}$ (nm) | 827 | 855 | 836 | 887 |
| UV-Film $\lambda_{edge}$ (nm) | 854 | 857 | 860 | — |
| $E_g$ (optical) (eV) | 1.45 | 1.45 | 1.44 | 1.40 |
| $E_{HOMO}$ (eV) | −5.60 | −5.60 | −5.63 | −5.62 |
| $E_{LUMO}$ (eV) | −4.15 | −4.15 | −4.19 | −4.22 |

[Comparative compounds]
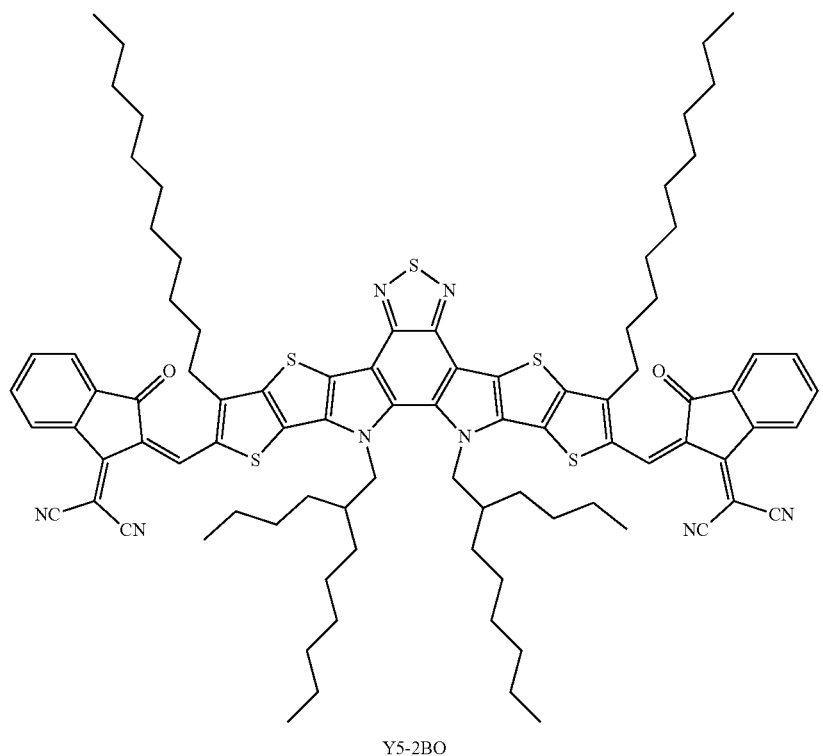
Y5-2BO
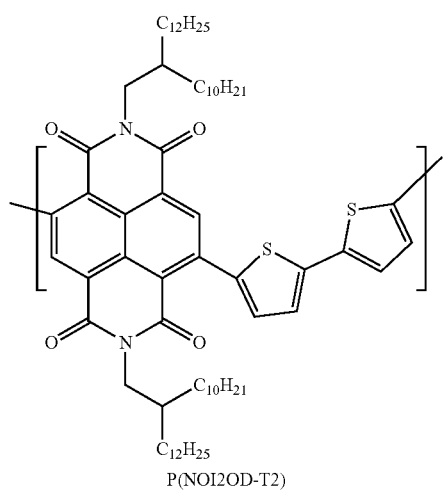
P(NOI2OD-T2)

Examples 5 to 8

Manufacture of organic solar cell

In order to evaluate performance for the use of an electron acceptor for an organic solar cell for the polymer of the present invention, an organic solar cell was manufactured as follows.

A glass substrate coated with indium tin oxide (ITO) as a transparent positive electrode (first electrode) was soaked in deionized water containing a washing solution, washed in an ultrasonic cleaner for 15 minutes, cleaned again with deionized water, acetone, and isopropyl alcohol (IPA) three times each, and then dried in an oven at 130° C. for 5 hours. The ITO glass substrate washed as described above was treated with ultraviolet rays/ozone for 15 minutes, zinc oxide nanoparticles (ZnO.NPs) were spin-coated, and a heat treatment was performed at 100° C. for 10 minutes to form a ZnO.NPs layer having a thickness of 30 nm.

The device was transferred to a glove box filled with argon and then a photoactive layer was formed.

In order to form the photoactive layer, the polymer of the present invention (each polymer prepared in Examples 1 to 4) as an electron acceptor and PBDB-T as an electron donor were dissolved at a weight ratio of 1:1 in chlorobenzene (CB) at a concentration of 20 mg/mL, 0.5 v/v% of DIO (1,8-diiodooctane) was added, and stirring was performed to prepare an organic semiconductor solution.

The organic semiconductor solution was filtered through a 0.45 μm (PTFE) syringe filter, spin-coated on the ZnO.NPs layer, annealed at 160° C. for 30 minutes to prepare a photoactive layer having a thickness of 100 nm. Subsequently, an Ag electrode having a thickness of 100 nm was deposited as a $MoO_3$ top electrode having a thickness of 10 nm on the photoactive layer under vacuum of $3\times10^{-6}$ torr in a thermal evaporator to manufacture an organic solar cell having a conventional structure of [Glass/ITO/ZnO/photoactive layer (polymer of the present invention: PBDB-T)/$MoO_3$/Ag].

In order to examine the photoelectric force properties of the manufactured organic solar cell, a solar simulator and a radiant power meter were used to produce 100 mW sunlight under the condition of AM 1.5, and a 1 kW solar simulator (Newport 91192) was used to measure the current density-voltage properties of the organic solar cell.

Open voltage ($V_{oc}$), short circuit current ($J_{sc}$), fill factor (FF), and power conversion efficiency (PCE) which are the electrical properties of the manufactured organic solar cell were confirmed and the results are shown in the following Table 3.

Each of $V_{oc}$ (V) and $J_{sc}$ (mA/cm$^2$) represents a voltage value when current is 0 and a current value when voltage is 0, respectively, in a current-voltage curve of the manufactured device.

In addition, fill factor (FF) is calculated from the following Mathematical Formula 1:

[Mathematical Formula 1]

$$FF = V_{mpp} \cdot J_{mpp} / V_{oc} \cdot J_{sc}$$

wherein $V_{mpp}$ and $J_{mpp}$ are a voltage value and a current value, respectively, at a point showing a maximum power when measuring current-voltage of the manufactured device, and $V_{oc}$(V) and $J_{sc}$(mA/cm$^2$) are a voltage value when the current is 0 and a current value when the voltage is 0, respectively, in the current-voltage curve of the manufactured device.

Furthermore, the power conversion efficiency (%) is calculated from the following Mathematical Formula 2:

[Mathematical Formula 2]

$$\text{Power conversion efficiency (\%)} = 100 \times FF \times V_{oc} \cdot J_{sc} / P_{in}$$

wherein FF, $V_{oc}$, and $J_{sc}$ are as defined in Mathematical Formula 1, and $P_{in}$ is a total energy of light incident on the device.

Comparative Example 1

Manufacture of organic solar cell

An organic solar cell was manufactured in the same manner as in Example 5, by using Y5-2BO exemplified as the comparative compound instead of the polymer of the present invention, and the characteristics were confirmed.

Comparative Example 2

Manufacture of organic solar cell

An organic solar cell was manufactured in the same manner as in Example 5, by using P(NDI2OB-T2) exemplified as the comparative compound instead of the polymer of the present invention, and the characteristics were confirmed.

TABLE 3

| Electron acceptor | $V_{oc}$ (V) [a] | $J_{oc}$ (mA/cm$^2$) [a] | Cal. $J_{oc}$ (mA/cm$^2$) | FF [a] | PCF $_{arg/max}$ (%) [a] |
|---|---|---|---|---|---|
| Comparative Example 1 Y5-2BO | 0.90 ± 0.00 | 13.0 ± 0.11 | 12.7 | 0.60 ± 0.01 | 6.91 ± 0.09 (7.02) |
| Example 5 R(YS2BOBDT-H) | 0.93 ± 0.01 | 18.6 ± 0.17 | 18.4 | 0.51 ± 0.02 | 8.65 ± 0.14 (8.81) |
| Example 6 P(Y52BOBDT-F) | 0.93 ± 0.01 | 19.0 ± 0.23 | 18.6 | 0.55 ± 0.01 | 9.64 ± 0.15 (9.83) |
| Example 7 P(Y52BOBDT-Cl) | 0.92 ± 0.00 | 18.7 ± 0.20 | 18.5 | 0.61 ± 0.02 | 10.52 ± 0.18 (10.84) |
| Compatative Example 2 P(NDI2OD-T2) | 0.87 ± 0.01 | 13.1 ± 0.08 | 13.5 | 0.52 ± 0.02 | 5.86 ± 0.07 (6.00) |

[a] All data refer to an average value of data obatined from 10 or more devices.

As shown in Table 2, in the case of the polymer according to the present invention, no change in film conditions was observed despite a change in temperature. Thus, the photoactive layer prepared using the polymer according to the present invention may implement excellent performance and morphology.

In addition, as shown in Table 3, it was confirmed that the organic solar cell adopting the polymer according to the present invention in the photoactive layer as an electron acceptor may implement very high power conversion efficiency. It was found that this is resulted from the characteristic substituent and the structural characteristic of the polymer according to the present invention.

The organic solar cell according to the present invention has very stable thermal and chemical stability as well as improved power conversion efficiency. In addition, the organic solar cell adopting the compound according to the present invention has excellent long-term stability, and thus, maintains the initial value without significant change in power conversion efficiency being observed even after a long period of time, thereby having excellent durability. In addition, the polymer of the present invention had improved electron affinity as compared with Comparative Example 1 or 2 which is a known non-fullerene-based electron acceptor as well as PC71BM which is a conventional fullerene-based electron acceptor, and also showed significantly improved power conversion efficiency due to its excellent compatibility with the electron donor. Simultaneously, since the polymer of the present invention showed an effect of having significantly rising open voltage ($V_{oc}$) and short circuit current (Jsc), it was confirmed that the polymer may be applied as a compound replacing a fullerene-based electron acceptor.

Accordingly, when the polymer according to the present invention is adopted as a non-fullerene-based electron acceptor, high short circuit current ($J_{sc}$) and FF as well as excellent power conversion efficiency may be implemented, and thus, the polymer may be used as a compound which may replace a fullerene-based electron acceptor which has been conventionally widely used as an electron acceptor to improve the power conversion efficiency of the organic solar cell and also to significantly improve stability and durability.

As described above, though the Examples of the present invention have been described in detail, a person skilled in the art may make various variations technical spirit present invention within the range without departing from the technical idea of the present invention, as defined in the claims which follow. Accordingly, any modification of the following Examples of the present invention may not depart from the technique of the present invention.

The invention claimed is:

1. A polymer comprising: a repeating unit represented by the following Chemical Formula 1 and a repeating unit represented by Chemical Formula 2:

[Chemical Formula 1]

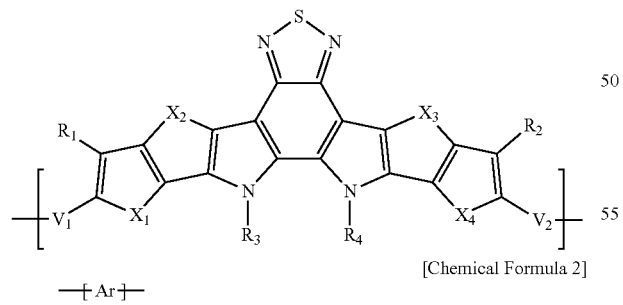

[Chemical Formula 2]

—[Ar]— wherein
$R_1$ to $R_4$ are independently of one another C1-C30 alkyl;
$X_1$ to $X_4$ are independently of one another O, S, or Se;
$V_1$ and $V_2$ are independently of each other a fused ring having methylidene as a linking group, the fused ring may be independently of each other further substituted by one or more substituents selected from C1-C30 alkyl, C1-C30 alkoxy, C1-C30 alkylthio, halogen, cyano, haloC1-C30 alkyl, nitro, and hydroxy, —CH2— of the fused ring may be replaced with carbonyl, thiocarbonyl, or

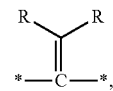

in which R is independently of each other hydrogen, C1-C30 alkyl, C1-C30 alkoxy, C1-C30 alkylthio, halogen, cyano, nitro, hydroxy, haloC1-C30 alkyl, C1-C30 alkylcarbonyl, or C1-C30 alkylcarbonyloxy, and the fused ring may include one or more heteroatoms selected from N, O, S, and Se; and Ar is benzodithiophenylene, benzodithienothiophenylene, naphthodithiophenylene, thiophenylene, benzothienoselenophenylene, benzodiselenophenylene, benzodiselenoselenophenylene, naphthodiselenophenylene, selenophenylene, or a combination thereof, and Ar may be independently of each other further substituted by one or more substituents selected from C1-C30 alkyl, C1-C30 alkoxy, C1-C30 alkylthio, C6-C30 aryl, C3-C30 heteroaryl, halogen, cyano, nitro, hydroxy, and a combination thereof.

2. The polymer of claim 1, wherein the repeating unit represented by Chemical Formula 2 is selected from the following structures:

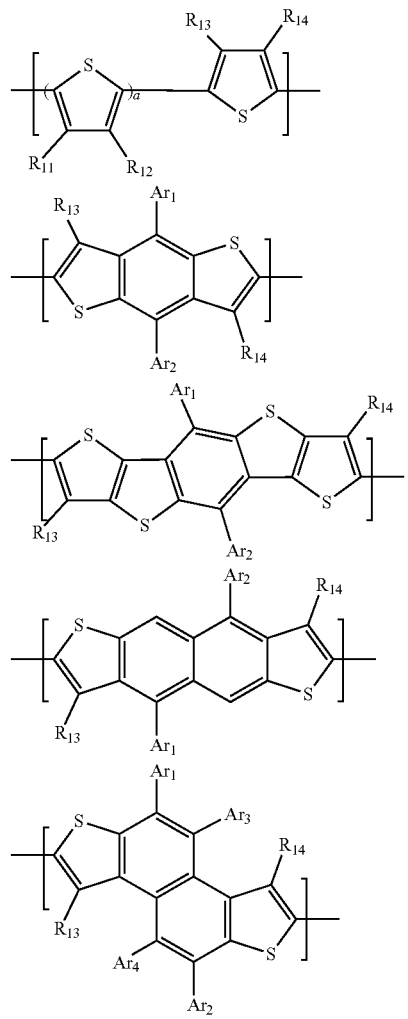

-continued

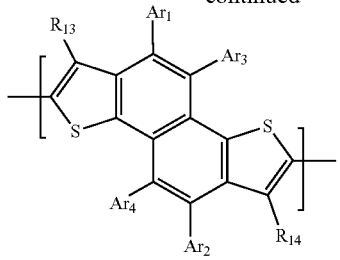

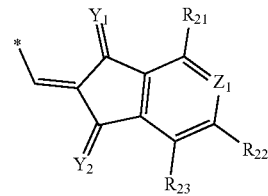

[Chemical Formula B]

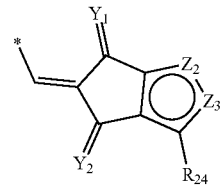

[Chemical Formula C]

wherein a is selected from integers of 0 to 5;

$R_{11}$ and $R_{12}$ are independently of each other C1-C30 alkyl;

$R_{13}$ and $R_{14}$ are independently of each other hydrogen or C1-C30 alkyl; and $Ar_1$ to $Ar_4$ are independently of one another hydrogen or C3-C30 heteroaryl, and the heteroaryl may further substituted by one or more substituents selected from C1-C30 alkyl, C1-C30 alkoxy, C1-C30 alkylthio, halogen, hydroxy, and a combination thereof.

3. The polymer of claim 2, wherein in the structure, $Ar_1$ and $Ar_2$ are independently of each other C3-C30 heteroaryl substituted by one or more substituents selected from C1-C30 alkyl, halogen, or a combination thereof, and $Ar_3$ and $Ar_4$ are hydrogen.

4. The polymer of claim 1, wherein $V_1$ and $V_2$ are independently of each other represented by the following Chemical Formula A:

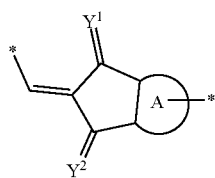

[Chemical Formula A]

wherein $Y_1$ and $Y_2$ are independently of each other O, S, or $CR_aR_b$, in which $R_a$ and $R_b$ are independently of each other halogen, cyano, nitro, hydroxy, C1-C30 alkylcarbonyl, or C1-C30 alkylcarbonyloxy; and A is a C6-C20 aromatic ring or C3-C20 heteroaromatic ring, and the aromatic ring and the heteroaromatic ring may be further substituted by one or more substituents selected from C1-C30 alkyl, C1-C30 alkoxy, C1-C30 alkylthio, halogen, cyano, haloC1-C30 alkyl, nitro, and hydroxy.

5. The polymer of claim 4, wherein $V_1$ and $V_2$ are independently of each other represented by the following Chemical Formula B or Chemical Formula C:

wherein $Y_1$ and $Y_2$ are independently of each other O, S, or $CR_aR_b$, in which $R_a$ and $R_b$ are independently of each other halogen, cyano, nitro, hydroxy, C1-C30 alkylcarbonyl, or C1-C30 alkylcarbonyloxy, and $Y_1$ and $Y_2$ are different from each other;

one of $Z_2$ and $Z_3$ is $CR_c$ and the other one is O, S, or Se, in which $R_c$ is hydrogen, C1-C30 alkyl, C1-C30 alkoxy, C1-C30 alkylthio, halogen, cyano, nitro, hydroxy, or haloC1-C30 alkyl;

$Z_1$ is $CR_d$ or N, in which $R_d$ is hydrogen, C1-C30 alkyl, C1-C30 alkoxy, C1-C30 alkylthio, halogen, cyano, nitro, hydroxy, or haloC1-C30 alkyl, or may be linked to $R_{21}$ or $R_{22}$ which is an adjacent substituent to form an aromatic fused ring; and $R_{21}$ to $R_{24}$ are independently of one another hydrogen, C1-C30 alkyl, C1-C30 alkoxy, C1-C30 alkylthio, halogen, cyano, nitro, hydroxy, or haloC1-C30 alkyl.

6. The polymer of claim 5, wherein $V_1$ and $V_2$ are independently of each other represented by the following Chemical Formula D, Chemical Formula E, Chemical Formula F, or Chemical Formula G:

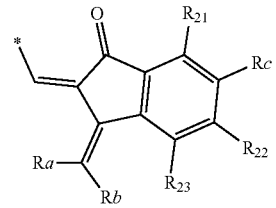

[Chemical Formula D]

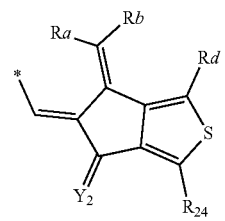

[Chemical Formula E]

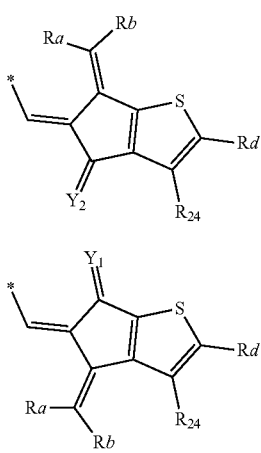

[Chemical Formula F]

[Chemical Formula G]

wherein $Y_1$ and $Y_2$ are independently of each other O or S;

$R_a$ and $R_b$ are independently of each other halogen, cyano, nitro, hydroxy, C1-C30 alkylcarbonyl, or C1-C30 alkylcarbonyloxy;

$R_c$ and $R_d$ are independently of each other hydrogen, C1-C30 alkyl, C1-C30 alkoxy, C1-C30 alkylthio, halogen, cyano, or haloC1-C30 alkyl; and $R_{21}$ to $R_{24}$ are independently of one another hydrogen, C1-C30 alkyl, C1-C30 alkoxy, C1-C30 alkylthio, halogen, cyano, or haloC1-C30 alkyl.

7. The polymer of claim 1, wherein the polymer includes a repeating unit represented by the following Chemical Formula 3 and a repeating unit represented by Chemical Formula 4:

[Chemical Formula 3]

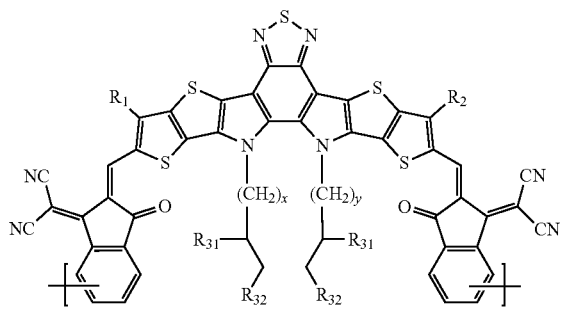

[Chemical Formula 4]

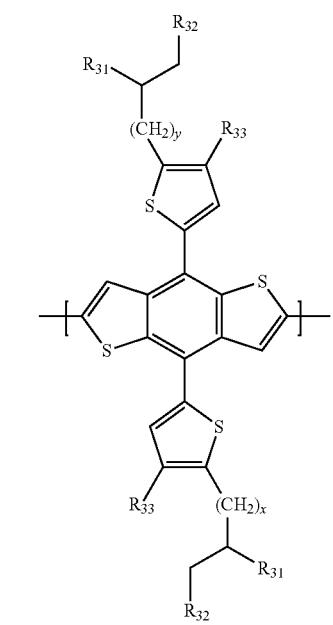

wherein $R_1$ and $R_2$ are independently of each other straight chain C8-C30 alkyl;

$R_{31}$ and $R_{32}$ are independently of each other branched chain C1-C7 alkyl;

x and y are independently of each other an integer selected from 1 to 7; and $R_{33}$ is independently of each other hydrogen, fluoro or chloro.

8. The polymer of claim 1, wherein the polymer satisfies 0<p<1, 0<q<1, and p+q=1, wherein p is a mole fraction of the repeating unit represented by Chemical Formula 1 and q is a mole fraction of the repeating unit represented by Chemical Formula 2.

9. An organic electronic device comprising the polymer of claim 1.

10. The organic electronic device of claim 9, wherein the organic electronic device is an organic solar cell, an organic thin film transistor, an organic memory, an organic photoreceptor, or an organic photosensor.

11. The organic electronic device of claim 9, wherein the organic electronic device is an organic solar cell.

12. The organic electronic device of claim 9, wherein the polymer is included in a photoactive layer of the organic solar cell.

13. The organic electronic device of claim 10, wherein the polymer is used as an electron acceptor.

* * * * *